United States Patent
Lin

(10) Patent No.: US 9,768,038 B2
(45) Date of Patent: Sep. 19, 2017

(54) SEMICONDUCTOR DEVICE AND METHOD OF MAKING EMBEDDED WAFER LEVEL CHIP SCALE PACKAGES

(71) Applicant: STATS ChipPAC, Ltd., Singapore (SG)

(72) Inventor: Yaojian Lin, Singapore (SG)

(73) Assignee: STATS ChipPAC, Pte. Ltd., Singapore (SG)

( * ) Notice: Subject to any disclaimer, the term of this patent is extended or adjusted under 35 U.S.C. 154(b) by 19 days.

(21) Appl. No.: 14/139,312

(22) Filed: Dec. 23, 2013

(65) Prior Publication Data

US 2015/0179481 A1 Jun. 25, 2015

(51) Int. Cl.
*H01L 21/56* (2006.01)
*H01L 23/31* (2006.01)
*H01L 23/00* (2006.01)

(52) U.S. Cl.
CPC .......... *H01L 21/568* (2013.01); *H01L 21/561* (2013.01); *H01L 23/3114* (2013.01); *H01L 23/3135* (2013.01); *H01L 24/19* (2013.01); *H01L 24/96* (2013.01); *H01L 24/97* (2013.01); H01L 2224/04105 (2013.01); H01L 2224/11 (2013.01); H01L 2224/12105 (2013.01); H01L 2924/12041 (2013.01); H01L 2924/12042 (2013.01); H01L 2924/13091 (2013.01); H01L 2924/181 (2013.01); H01L 2924/1815 (2013.01); H01L 2924/18162 (2013.01); H01L 2924/3511 (2013.01)

(58) Field of Classification Search
CPC ......... H01L 23/31; H01L 24/96; H01L 24/97; H01L 2224/97; H01L 2224/96; H01L 2224/023; H01L 23/3157; H01L 23/3164; H01L 23/3192; H01L 23/3135
See application file for complete search history.

(56) References Cited

U.S. PATENT DOCUMENTS

| | | | |
|---|---|---|---|
| 5,763,952 A | * | 6/1998 | Lynch ................ G01R 1/07342 257/666 |
| 5,866,952 A | | 2/1999 | Wohnarowski et al. |
| 7,476,565 B2 | | 1/2009 | Yang et al. |
| 7,880,278 B2 | | 2/2011 | Jeng et al. |
| 8,486,803 B2 | | 7/2013 | Huang et al. |
| 2006/0194370 A1 | * | 8/2006 | Lee et al. ..................... 438/118 |

(Continued)

*Primary Examiner* — Peniel M Gumedzoe
(74) *Attorney, Agent, or Firm* — Robert D. Atkins; Patent Law Group: Atkins and Associates P.C.

(57) ABSTRACT

A semiconductor device includes a carrier and a plurality of semiconductor die disposed over the carrier. An encapsulant is deposited over the semiconductor die. A composite layer is formed over the encapsulant to form a panel. The carrier is removed. A conductive layer is formed over the panel. An insulating layer is formed over the conductive layer. The carrier includes a glass layer, a second composite layer formed over the glass layer, and an interface layer formed over the glass layer. The composite layer and encapsulant are selected to tune a coefficient of thermal expansion of the panel. The panel includes panel blocks comprising an opening separating the panel blocks. The encapsulant or insulating material is deposited in the opening. A plurality of support members are disposed around the panel blocks. An interconnect structure is formed over the conductive layer.

36 Claims, 36 Drawing Sheets

(56) References Cited

U.S. PATENT DOCUMENTS

| | | | |
|---|---|---|---|
| 2009/0108440 A1* | 4/2009 | Meyer | H01L 21/561 257/723 |
| 2009/0108444 A1* | 4/2009 | Chuang | H01L 21/568 257/737 |
| 2009/0294952 A1* | 12/2009 | Lin | H01L 23/3121 257/698 |
| 2010/0078786 A1* | 4/2010 | Maeda | H01L 23/16 257/678 |
| 2010/0110656 A1* | 5/2010 | Ko et al. | 361/818 |
| 2010/0224983 A1* | 9/2010 | Huang | H01L 21/568 257/692 |
| 2010/0320624 A1* | 12/2010 | Kang | H01L 21/568 257/787 |
| 2011/0298101 A1* | 12/2011 | Pagaila et al. | 257/659 |
| 2011/0316152 A1* | 12/2011 | Miki et al. | 257/737 |
| 2013/0053471 A1* | 2/2013 | Studart | B29C 67/24 523/115 |
| 2013/0059418 A1 | 3/2013 | Chiang et al. | |
| 2013/0147054 A1* | 6/2013 | Lin et al. | 257/774 |
| 2013/0295725 A1* | 11/2013 | Park | H01L 24/19 438/124 |

\* cited by examiner

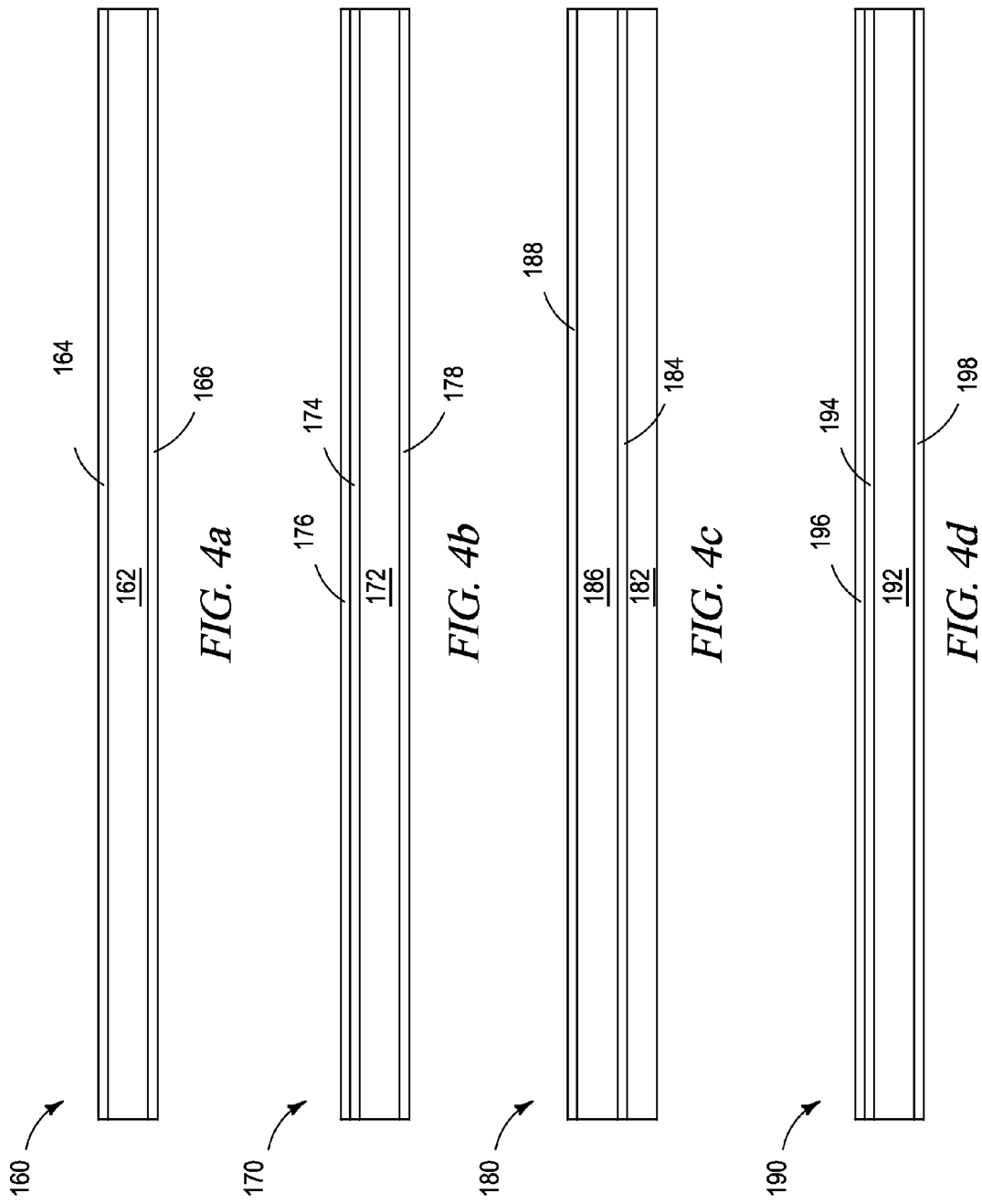

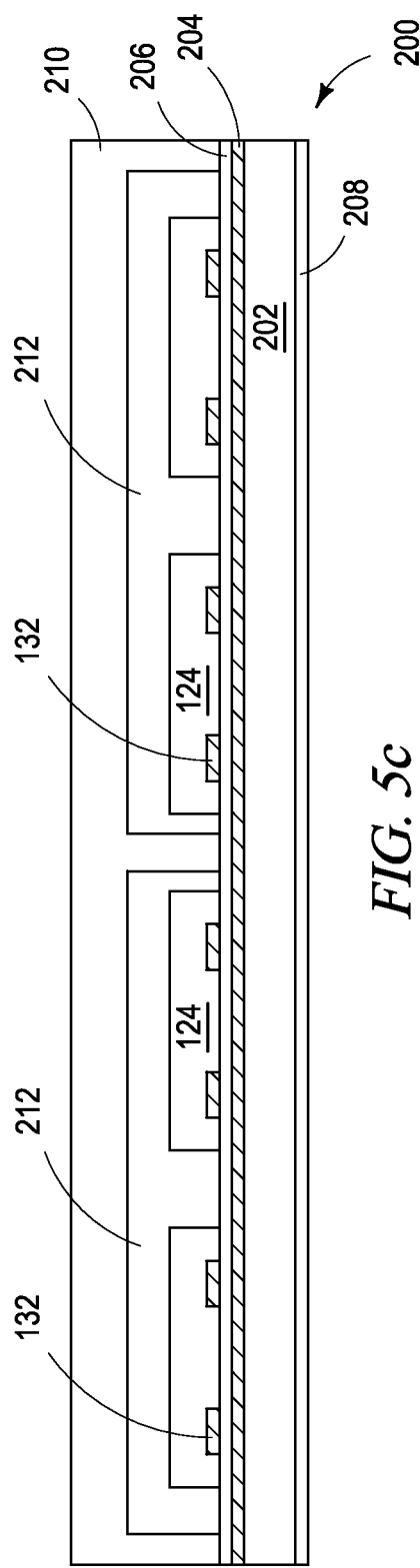
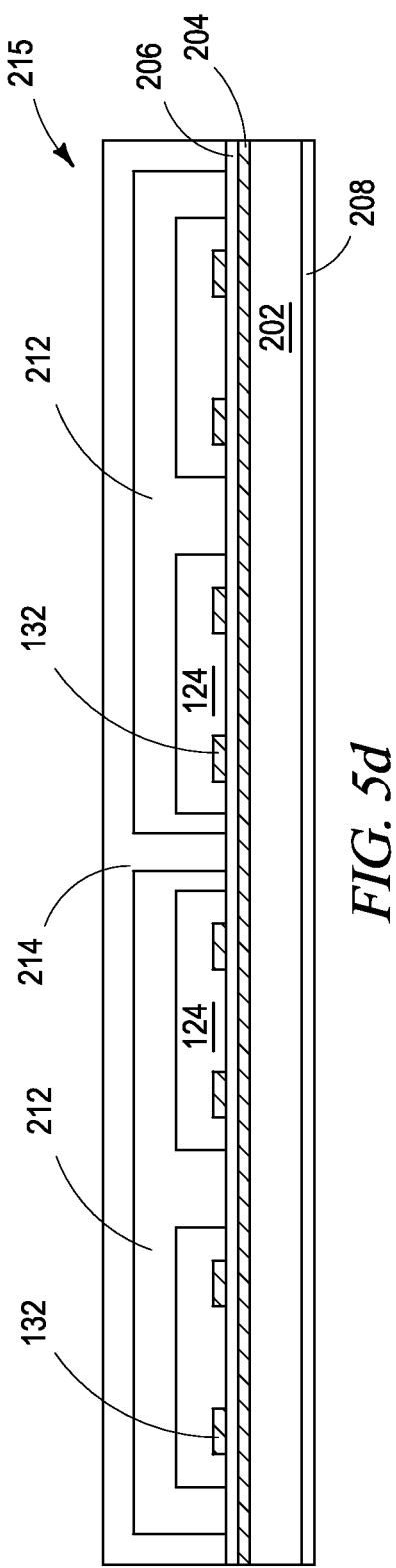

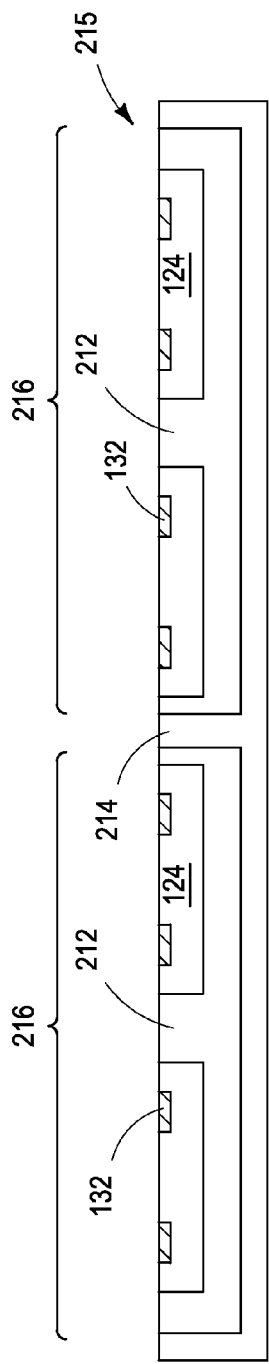
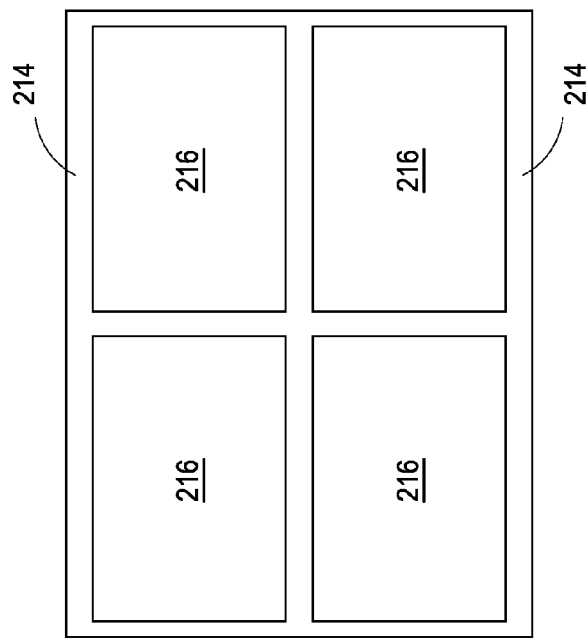
FIG. 5e
FIG. 5f

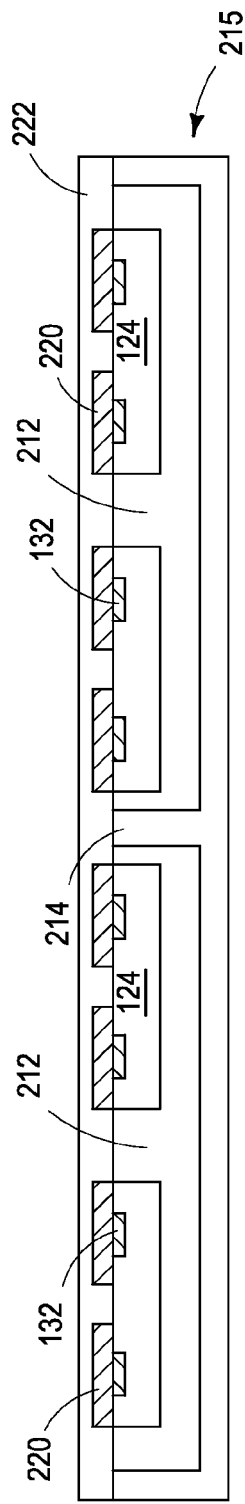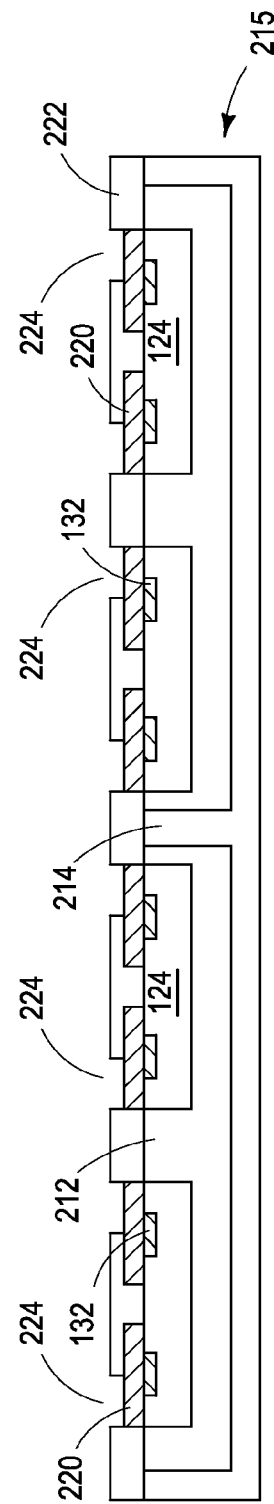

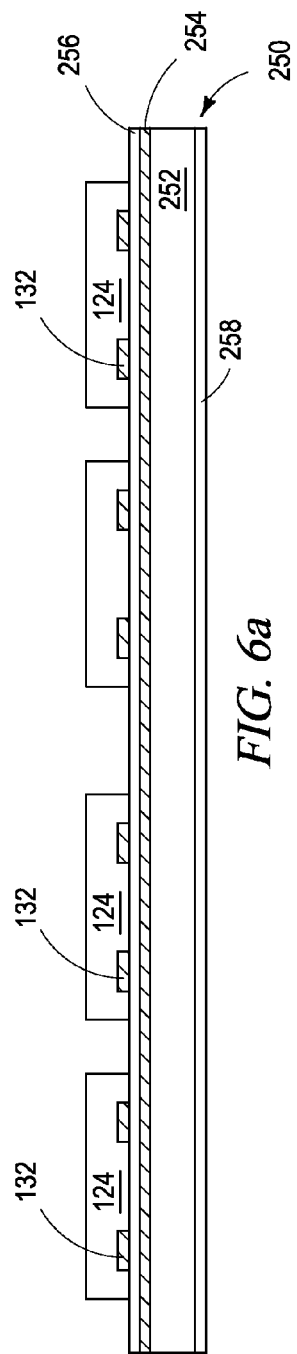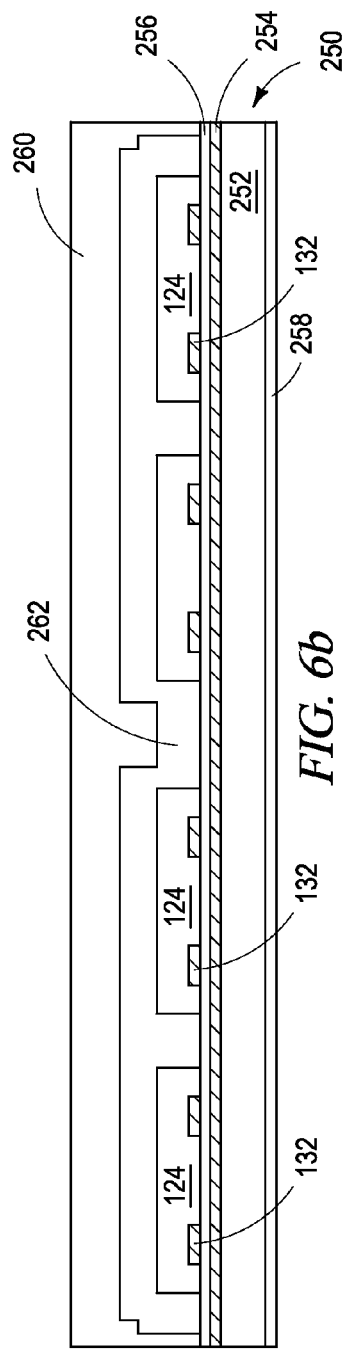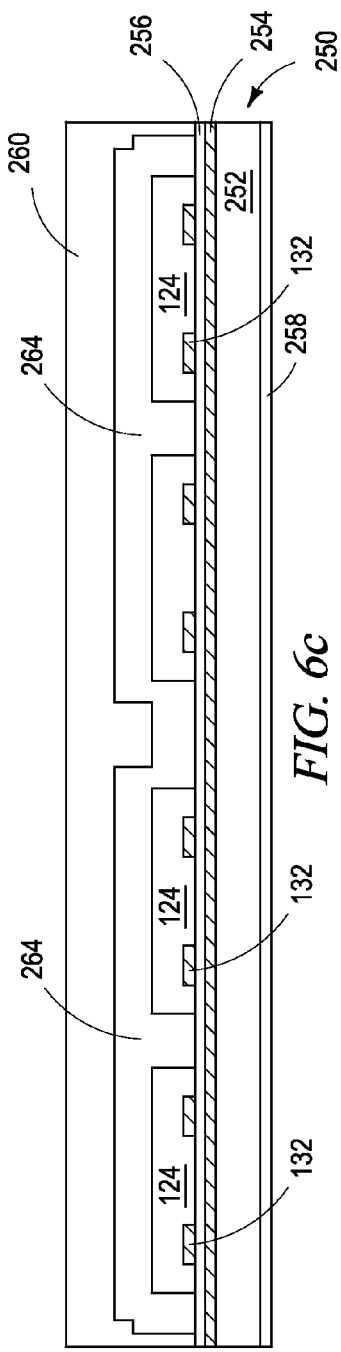

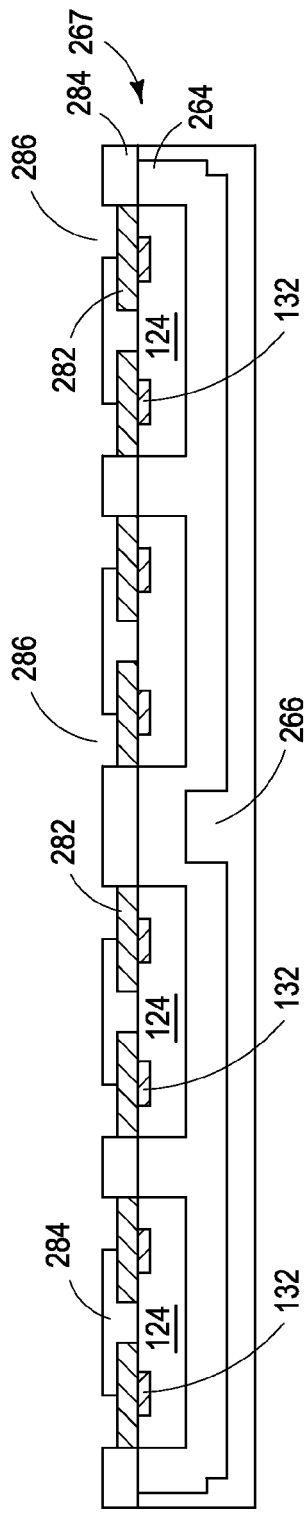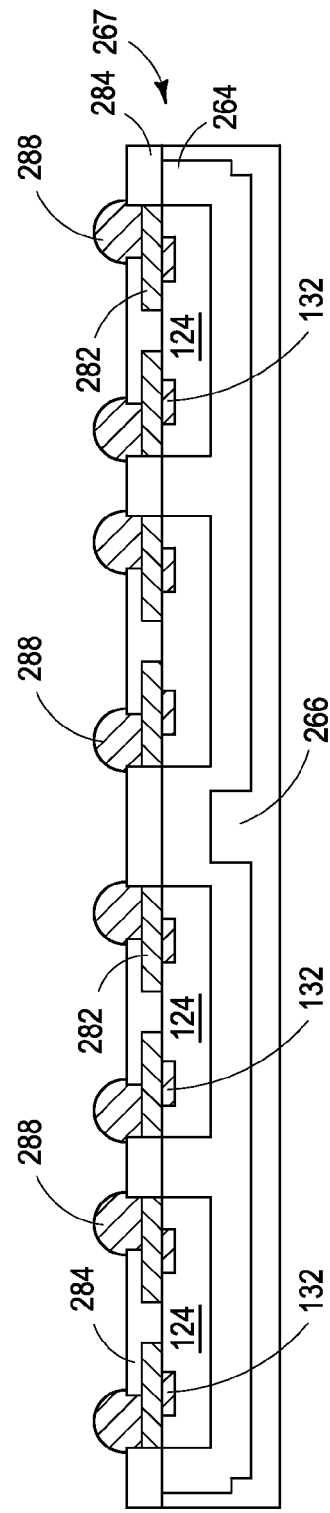

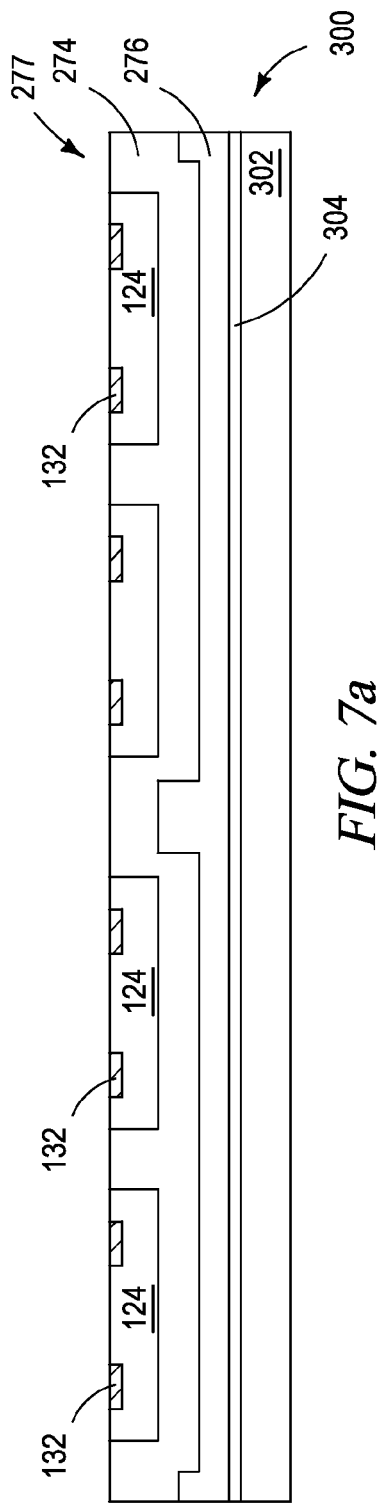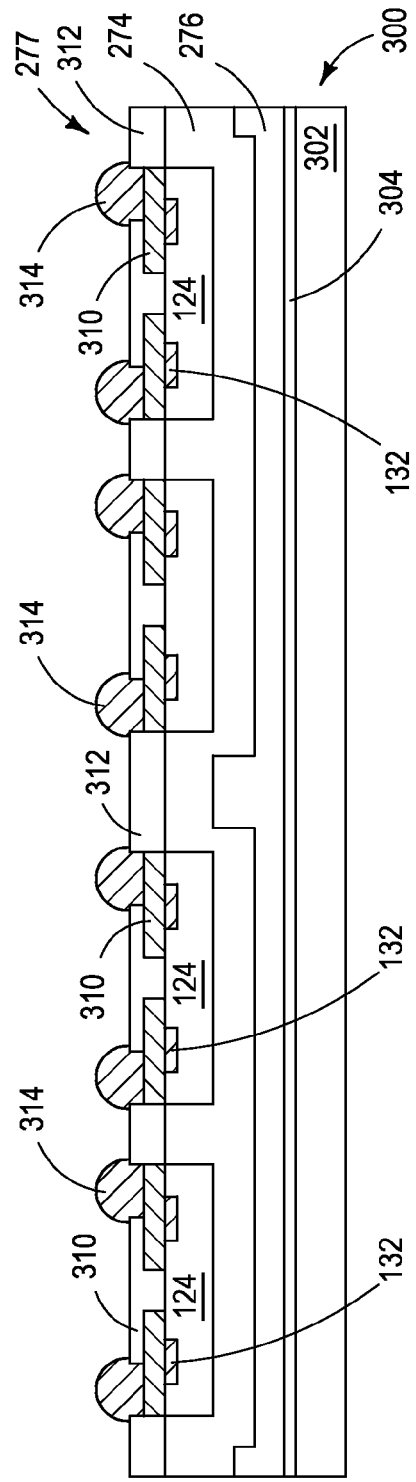

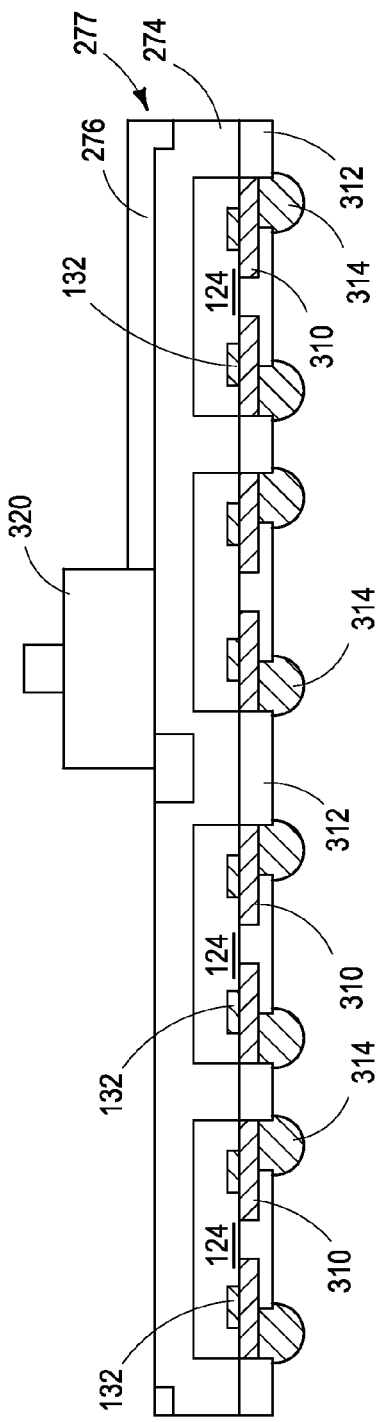
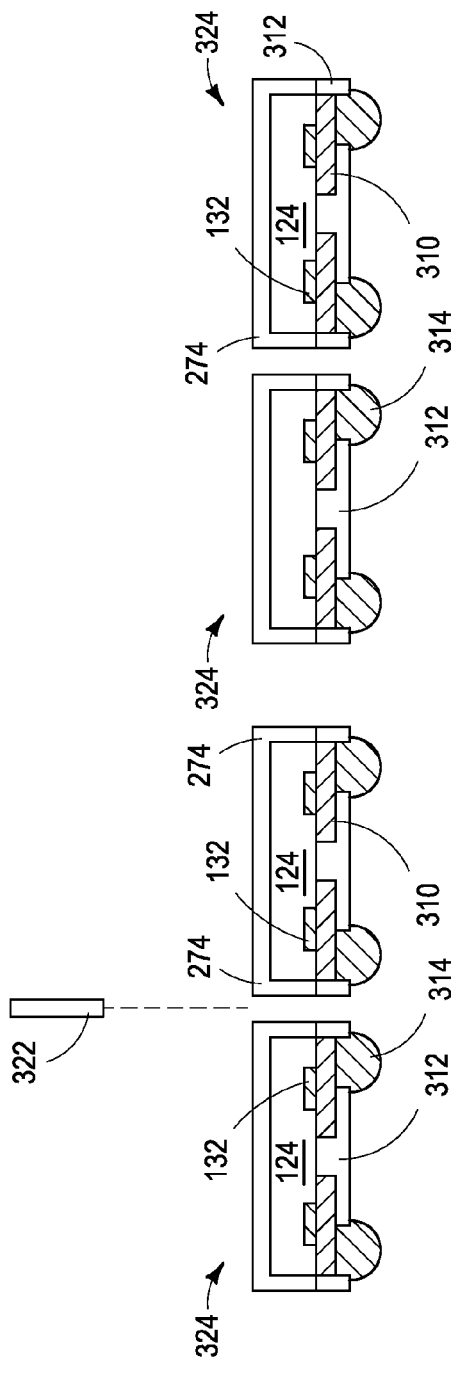
FIG. 7c
FIG. 7d

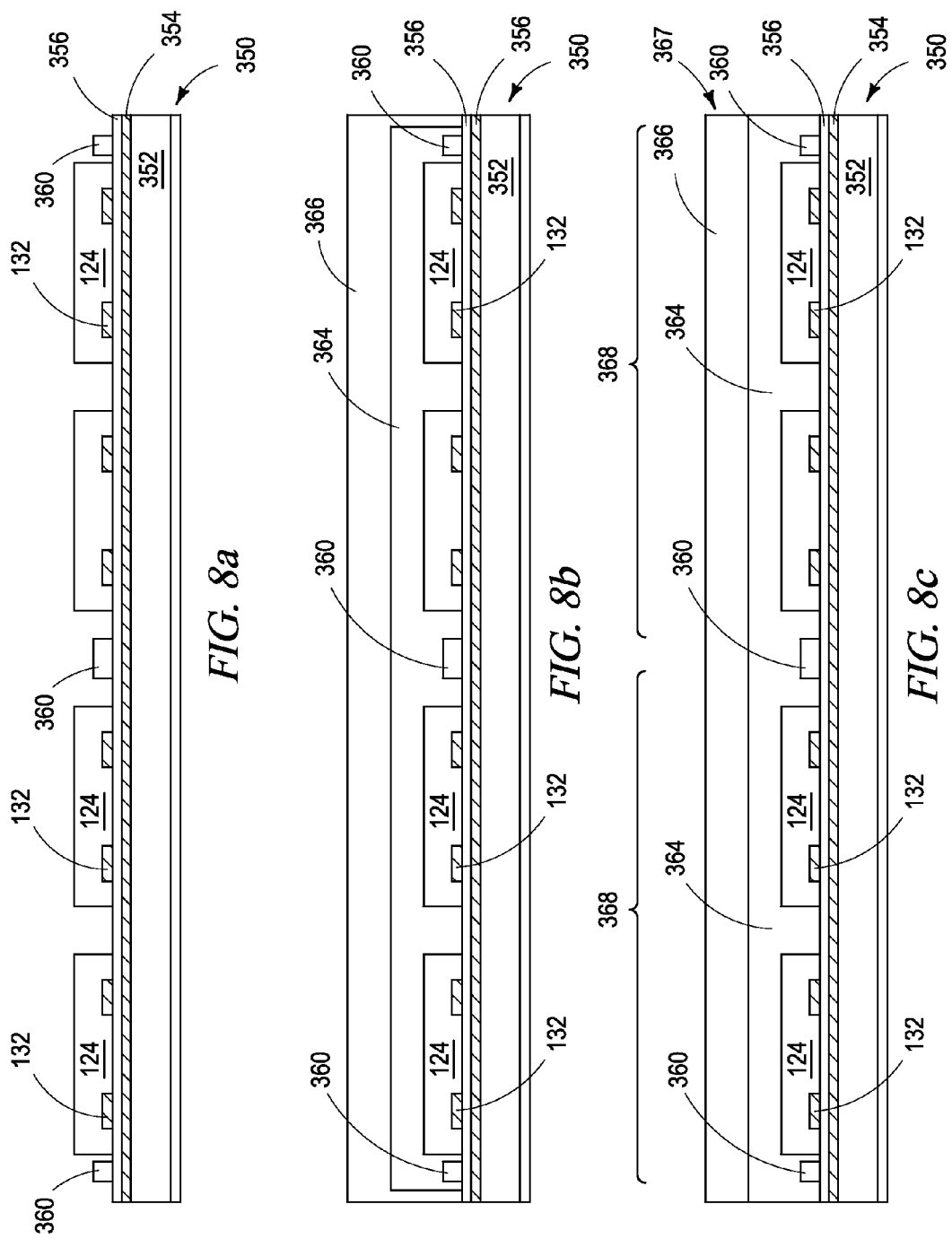

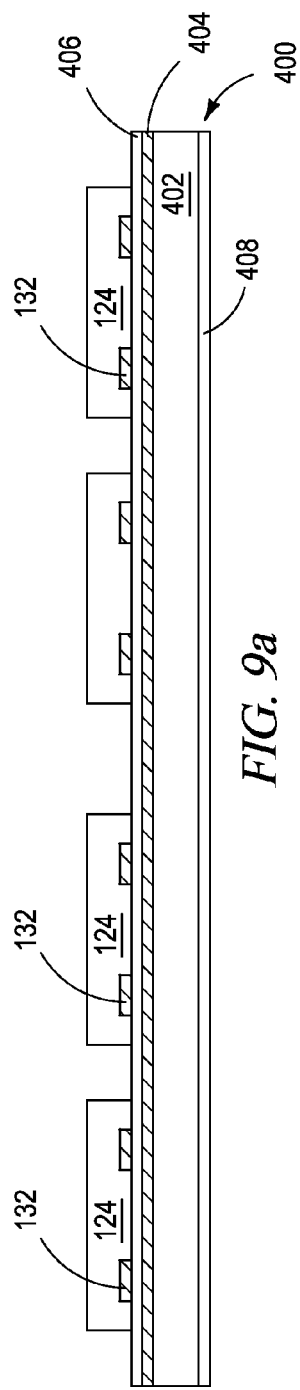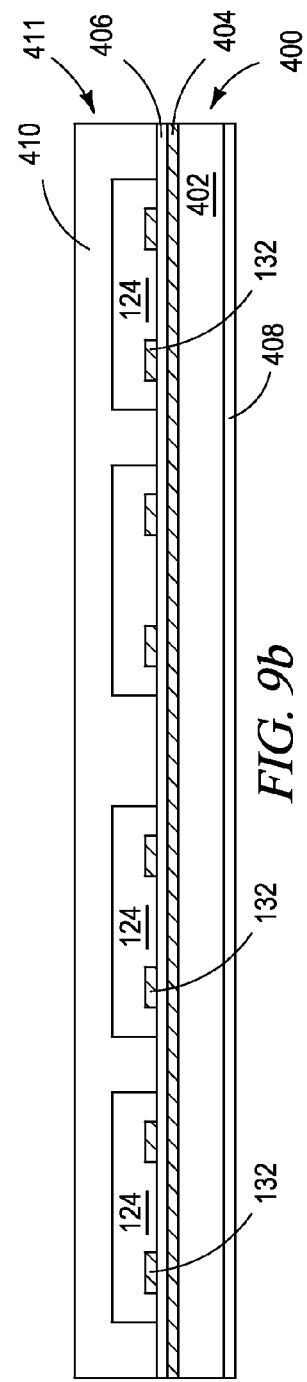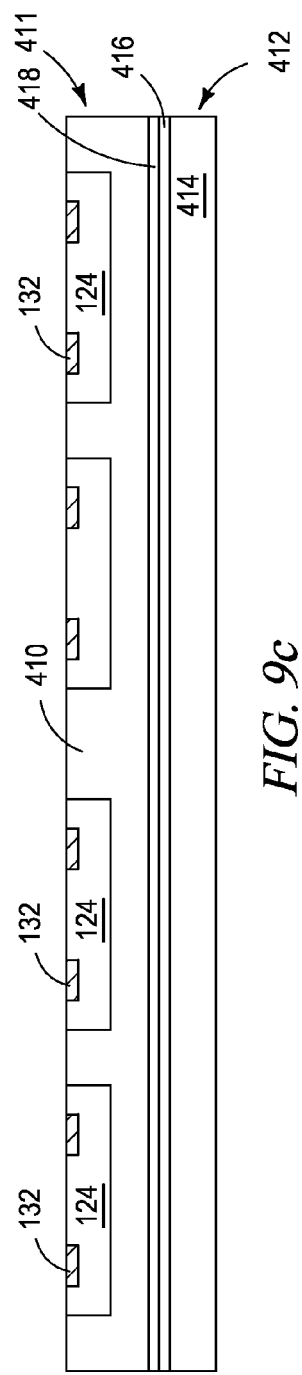

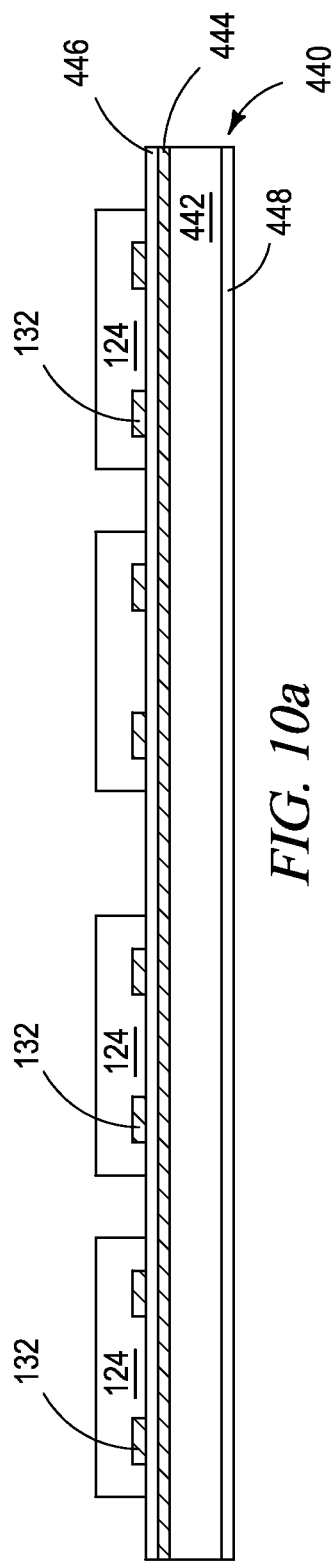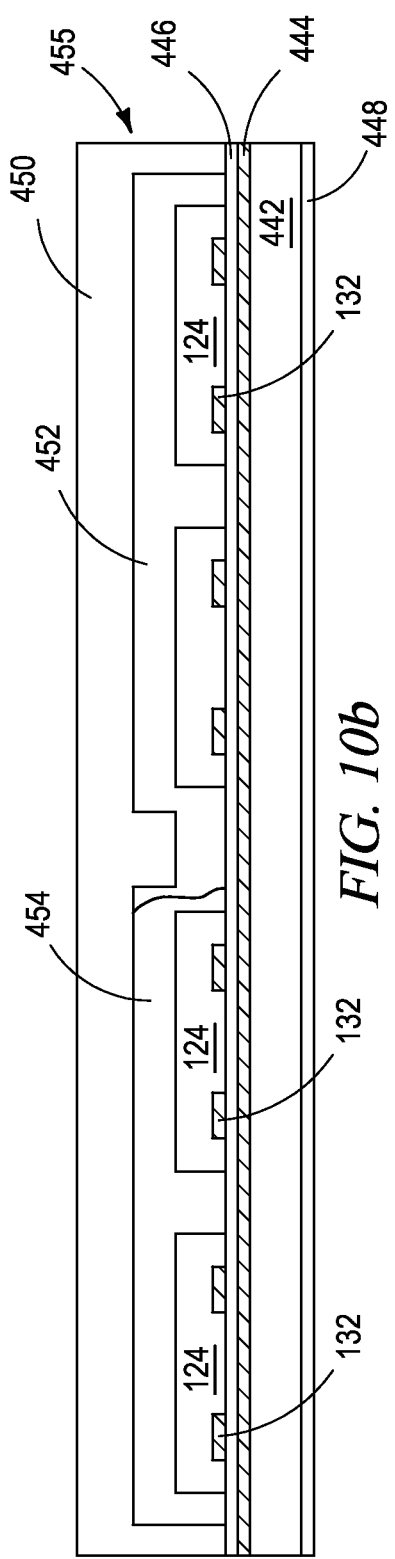

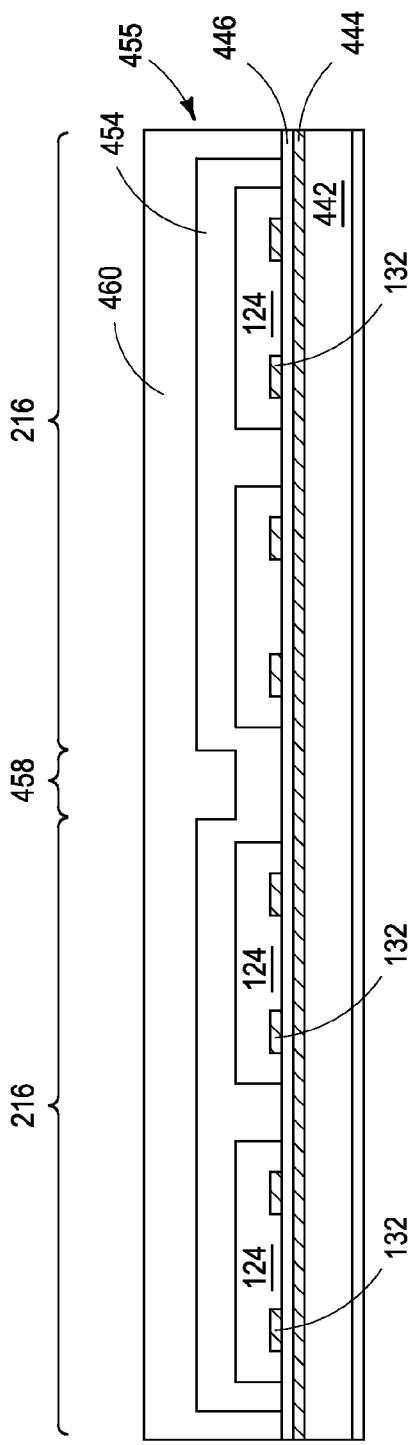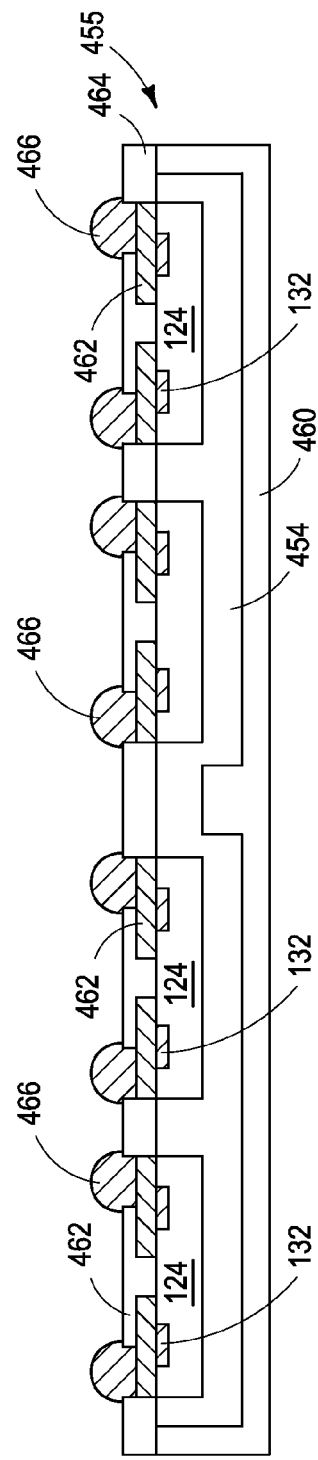
FIG. 10e
FIG. 10f

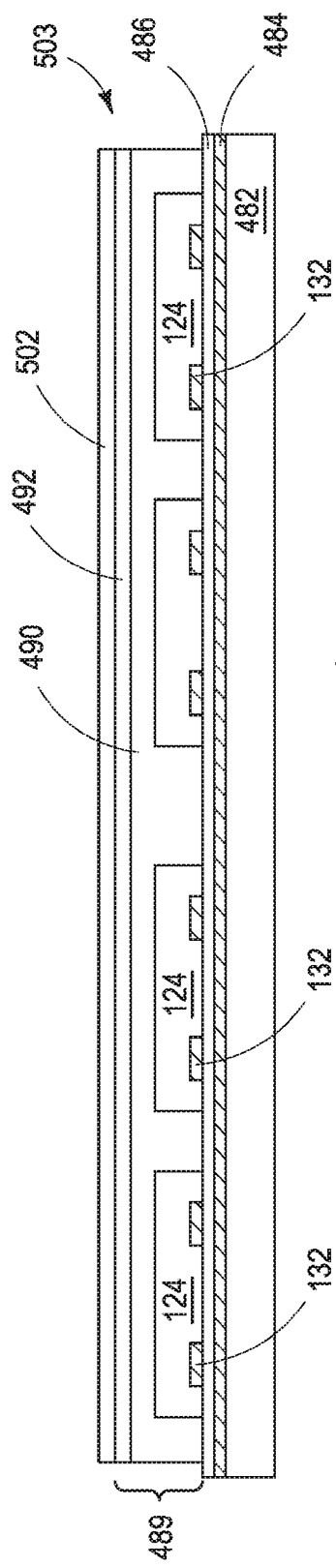
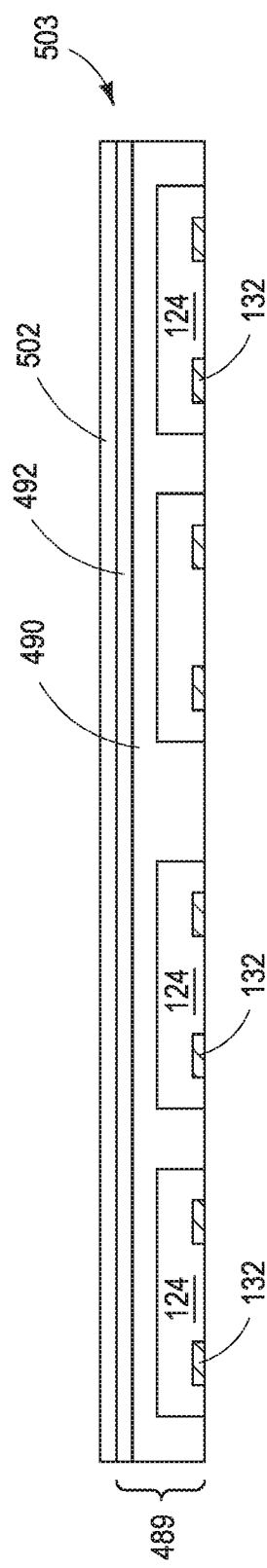

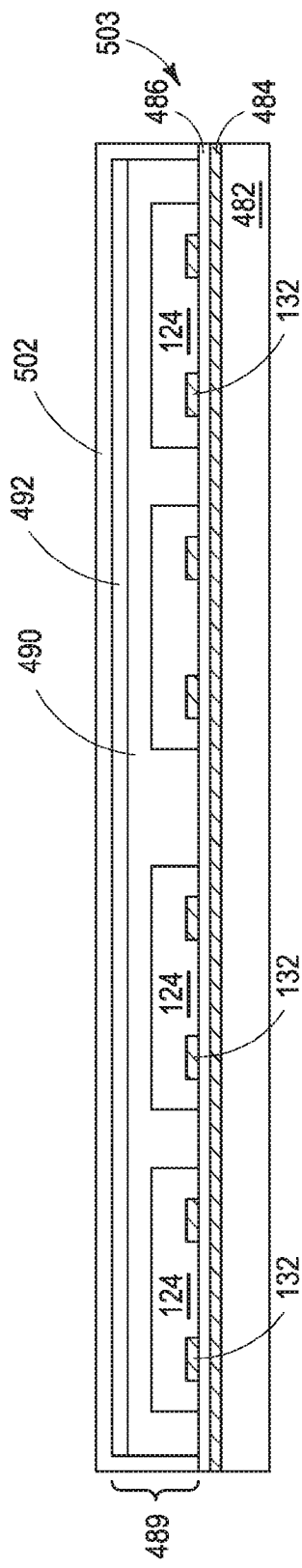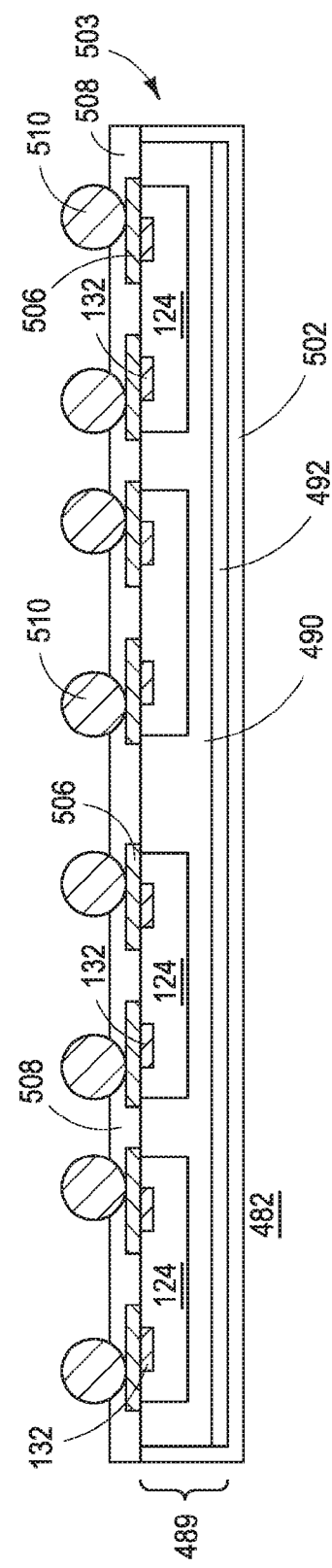
FIG. 11f
FIG. 11g

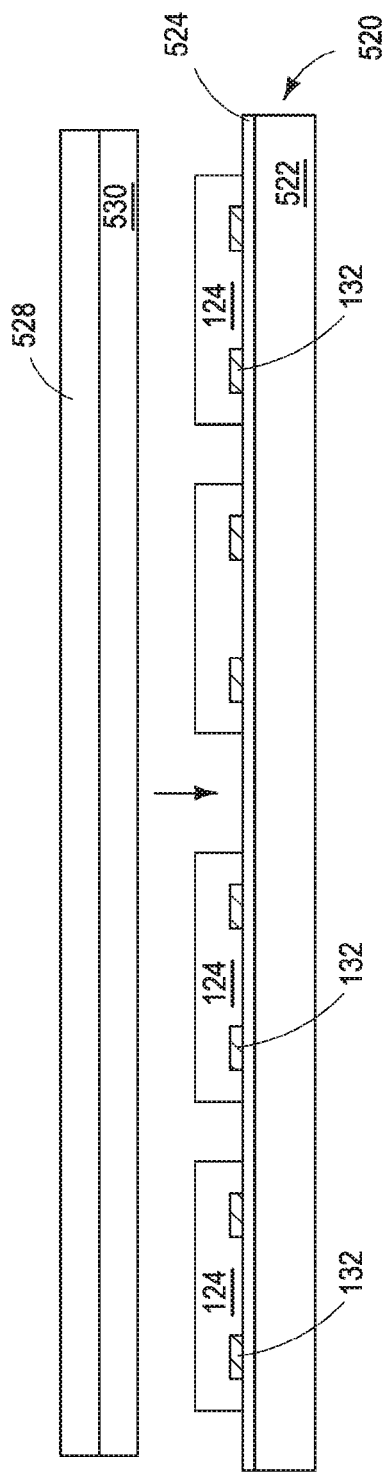
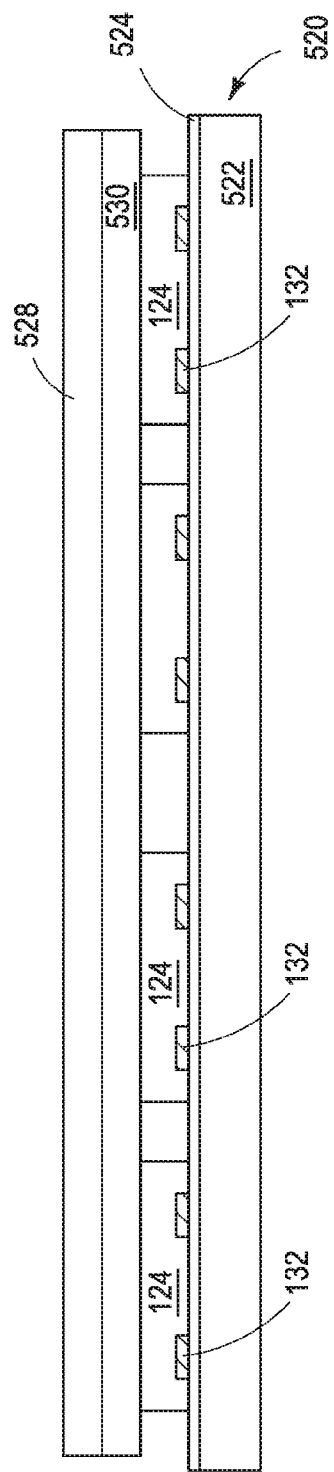
FIG. 12a
FIG. 12b

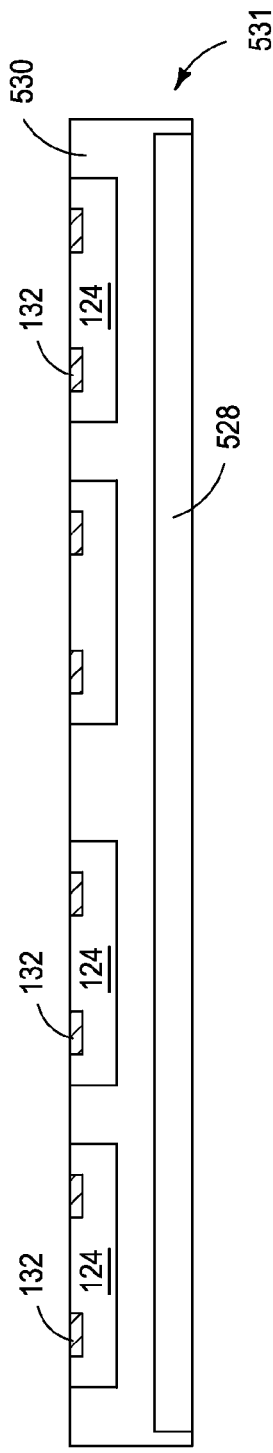
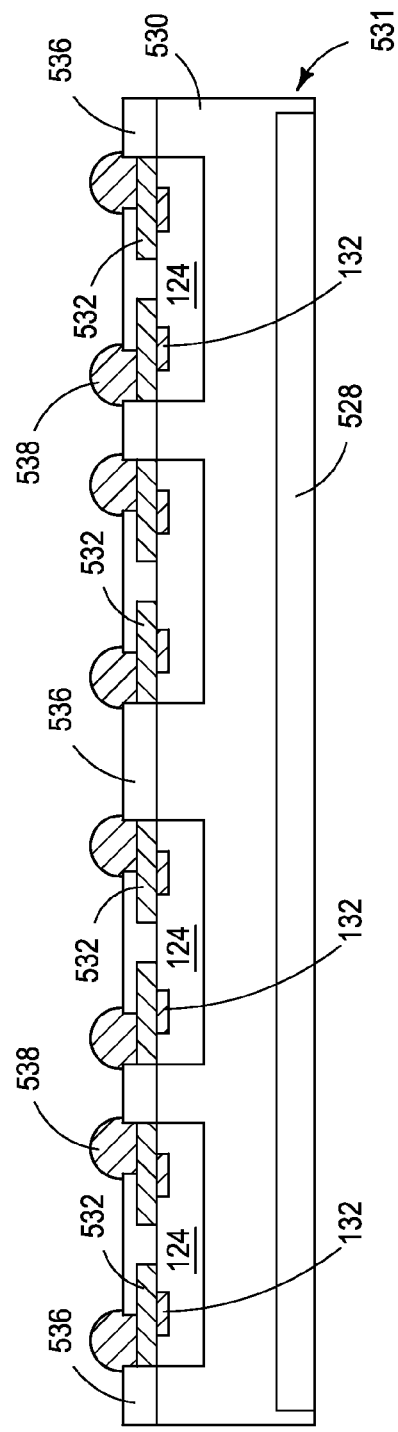

SEMICONDUCTOR DEVICE AND METHOD OF MAKING EMBEDDED WAFER LEVEL CHIP SCALE PACKAGES

FIELD OF THE INVENTION

The present invention relates in general to semiconductor devices and, more particularly, to a semiconductor device and method of making embedded wafer level chip scale packages (eWLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and are produced more efficiently. In addition, smaller semiconductor devices have a smaller footprint, which is desirable for smaller end products. A smaller semiconductor die size is achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer typically contains a plurality of semiconductor die separated by a saw street. Active and passive circuits are formed in a surface of each semiconductor die. An interconnect structure is formed over the surface of the semiconductor die. The semiconductor wafer is singulated into individual semiconductor die for use in a variety of electronic products. An important aspect of semiconductor manufacturing is high yield and corresponding low cost. Larger wafer sizes can lead to higher yield if the process is carried out without breaking a wafer. However, when processing wafer sizes in excess of 300 millimeters (mm) warpage and breakage during processing steps become more common and lead to lower yield.

SUMMARY OF THE INVENTION

A need exists for a simple and cost-effective semiconductor package to minimize warpage and breaking during processing steps and maintain high yield. Accordingly, in one embodiment, the present invention is a method of making a semiconductor device comprising the steps of providing a carrier, disposing a plurality of semiconductor die over the carrier, depositing an encapsulant over the semiconductor die, disposing a composite layer over the encapsulant to form a panel, removing the carrier, and forming a conductive layer over the panel.

In another embodiment, the present invention is a method of making a semiconductor device comprising the steps of providing a plurality of semiconductor die, depositing an encapsulant over the semiconductor die including a recess between the semiconductor die, forming a support layer over the encapsulant and recess to form a panel, and forming a conductive layer over the panel.

In another embodiment, the present invention is a method of making a semiconductor device comprising the steps of providing a plurality of semiconductor die, depositing an encapsulant over the semiconductor die, forming a support layer over the encapsulant to form a panel, and forming a conductive layer over the panel.

In another embodiment, the present invention is a semiconductor device comprising a plurality of semiconductor die and an encapsulant deposited over the semiconductor die including a recess between the semiconductor die. A support layer is deposited over the encapsulant.

BRIEF DESCRIPTION OF THE DRAWINGS

FIGS. 4a-4d illustrate carriers for processing a semiconductor device including layers of glass, composite material, adhesive tape, and metal foil;

FIGS. 5a-5k illustrate a process of forming a semiconductor device using panel blocks including semiconductor die and a composite support layer;

FIGS. 6a-6k illustrate a process of forming a semiconductor device using panel blocks including semiconductor die and a composite support layer partially between panel blocks;

FIGS. 7a-7d illustrate a process of forming a semiconductor device using panel blocks and a glass and composite carrier;

FIGS. 8a-8g illustrate a process of forming a semiconductor device using panel blocks with semiconductor die and support bars around the panel blocks;

FIGS. 9a-9g illustrate a process of forming a semiconductor device using a prelaminated carrier including glass and composite material;

FIGS. 10a-10h illustrate a process of forming a semiconductor device using panel blocks including semiconductor die and a molded support layer;

FIGS. 11a-11g illustrate a process of forming a semiconductor device using a resin coated copper film; and FIGS. 12a-12i illustrate a process of forming a semiconductor device with a glass support substrate embedded in encapsulant.

DETAILED DESCRIPTION OF THE DRAWINGS

Figure 1:
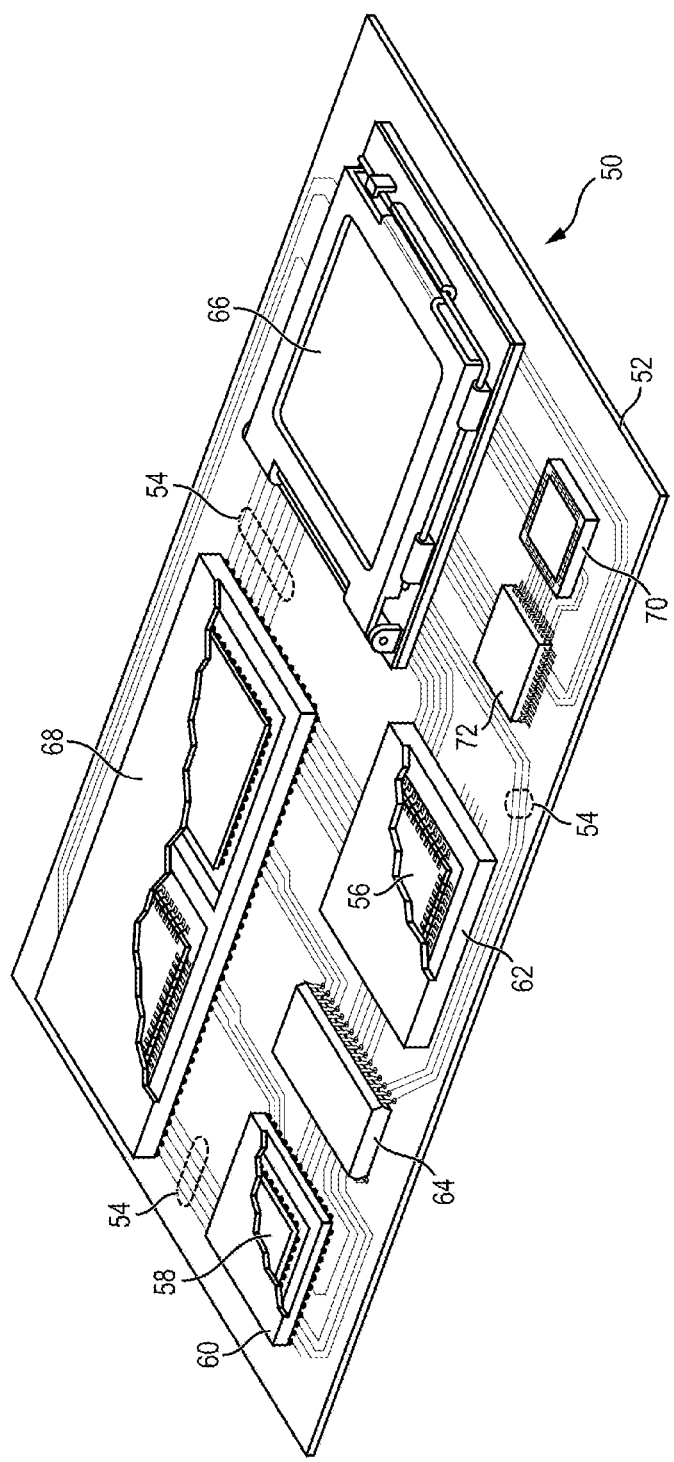
FIG. 1 illustrates a printed circuit board (PCB) with different types of packages mounted to the surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers are formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser-cutting tool or saw blade. After singulation, the individual semiconductor die are mounted to a package substrate that includes pins or contact pads for interconnection with other system components. Contact pads formed over the semiconductor die are then connected to contact pads within the package. The electrical connections are made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 is a stand-alone system that uses the semiconductor packages to perform one or more electrical functions. Alternatively, electronic device 50 is a subcomponent of a larger system. For example, electronic device 50 is part of a cellular phone, personal digital assistant (PDA), digital video camera (DVC), or other electronic communication device. Alternatively, electronic device 50 is a graphics card, network interface card, or other signal-processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen-printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, are connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices are manufactured using less expensive components and a streamlined manufacturing process. The resulting devices are less likely to fail and less expensive to manufacture resulting in a lower cost for consumers.

Figure 2A:
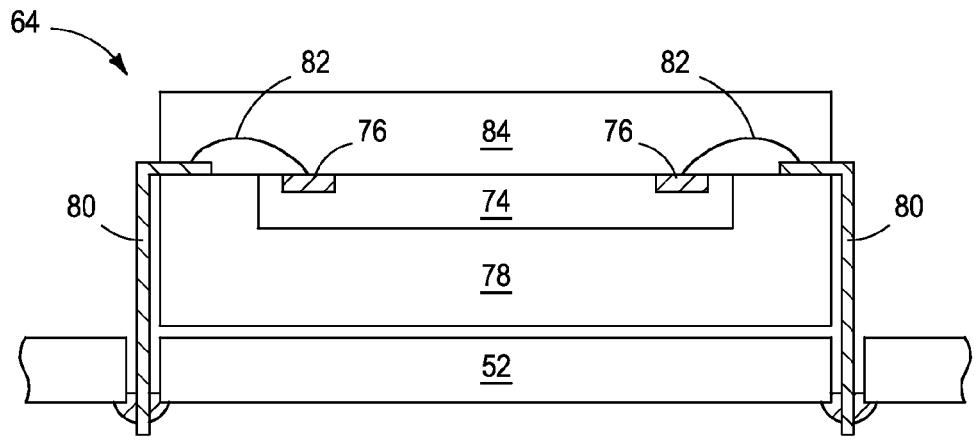
FIGS. 2a-2c illustrate further detail of the representative semiconductor packages mounted to the PCB.
Figure 2B:
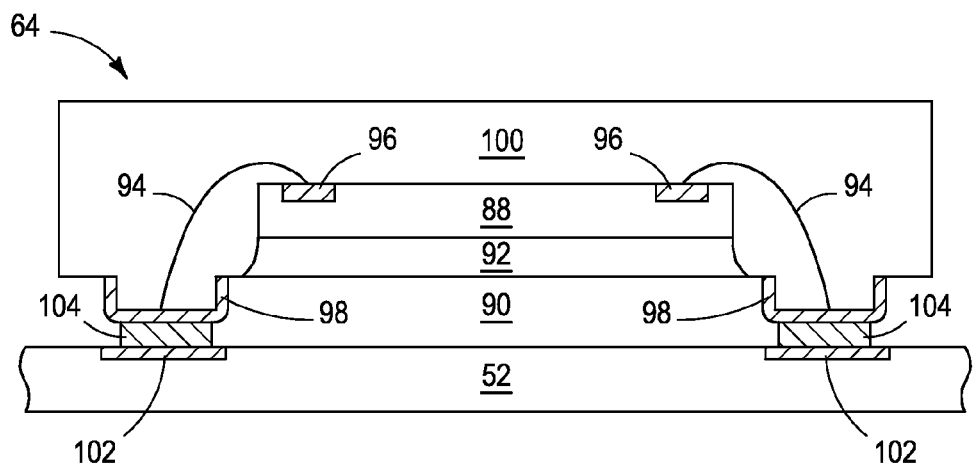
Figure 2C:
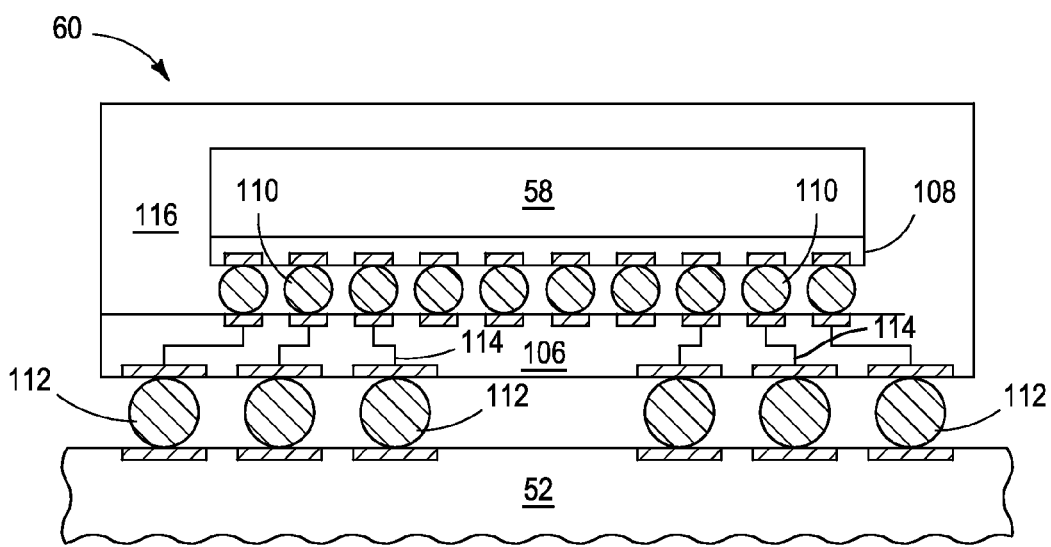

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulating packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, semiconductor die 58 is mechanically and electrically connected directly to PCB 52 using flipchip style first level packaging without intermediate carrier 106.

Figure 3A:
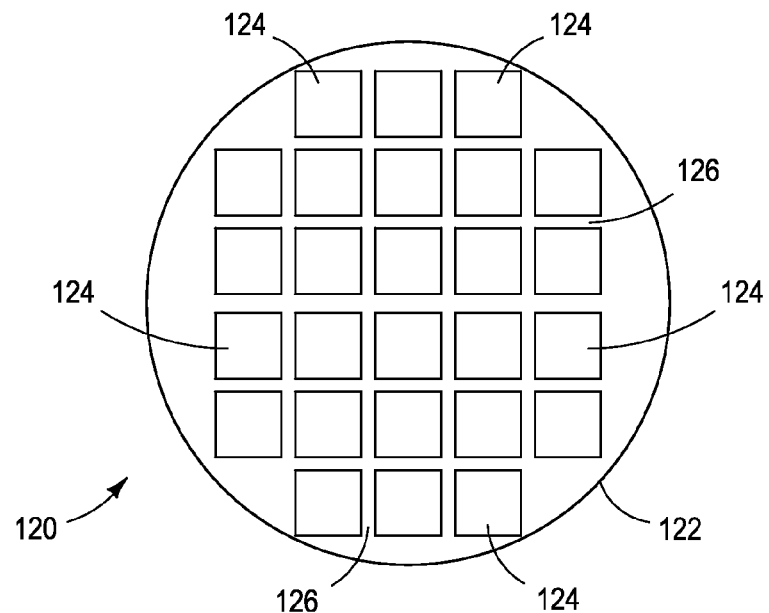
FIGS. 3a-3d illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 mm. In another embodiment, semiconductor wafer 120 has a width or diameter of 100-450 mm.

Figure 3B:
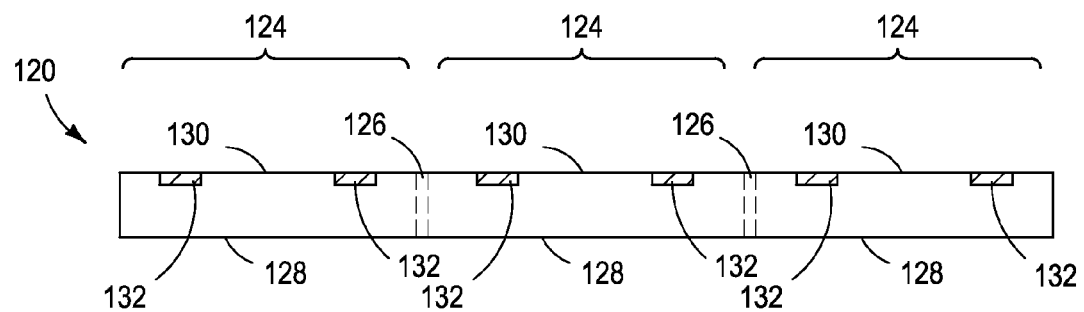

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 is one or more layers of Al, Cu, Sn, Ni, Au, Ag, or other suitable electrically conductive material. Conductive layer 132 operates as contact pads electrically connected to the circuits on active surface 130. Conductive layer 132 is formed as contact pads disposed side-by-side a first distance from the edge of semiconductor die 124, as shown in FIG. 3b. Alternatively, conductive layer 132 is formed as contact pads that are offset in multiple rows such that a first row of contact pads is disposed a first distance from the edge of the die, and a second row of contact pads alternating with the first row is disposed a second distance from the edge of the die.

Figure 3C:
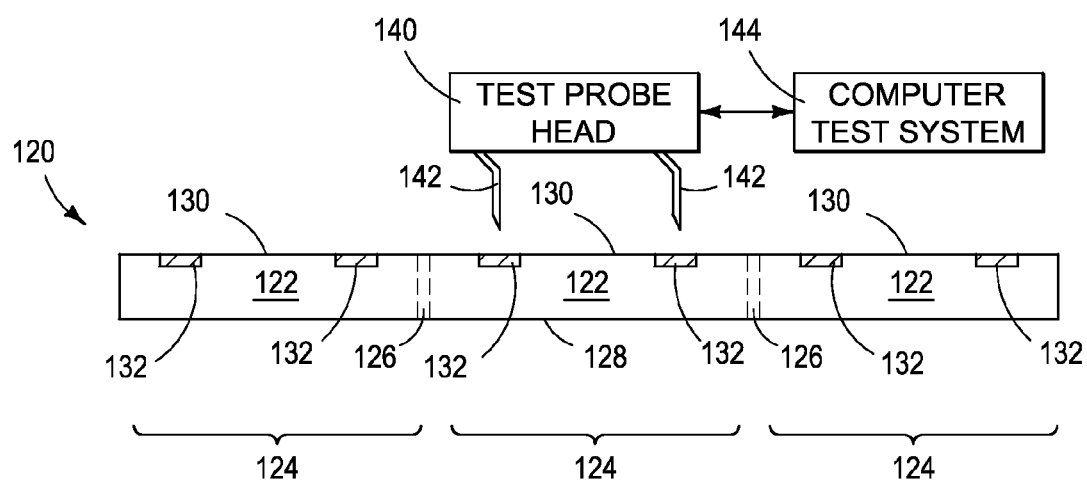

In FIG. 3c, semiconductor wafer 120 undergoes electrical testing and inspection as part of a quality control process. Manual visual inspection and automated optical systems are used to perform inspections on semiconductor wafer 120. Software is used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. Test probe head 140 includes a plurality of probes 142. Probes are used to make electrical contact with nodes or contact pads 132 on each semiconductor die 124 and provides electrical stimuli to the contact pads. Semiconductor die 124 responds to the electrical stimuli, which is measured by a computer test system 144 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3D:
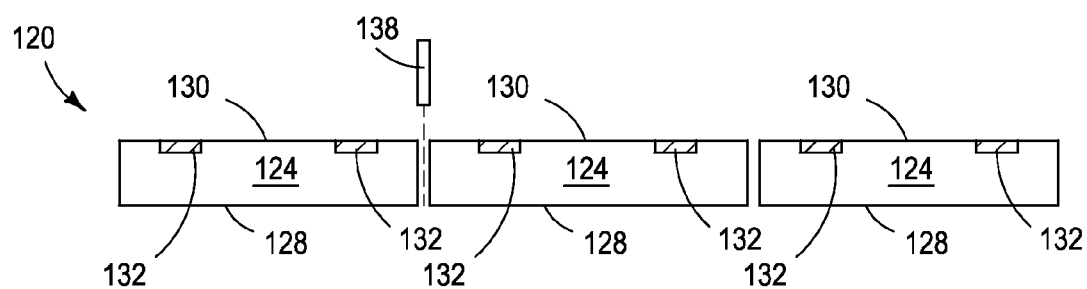

In FIG. 3d, semiconductor wafer 120 is singulated through saw street 126 using a saw blade or laser-cutting tool 138 into individual semiconductor die 124. The individual semiconductor die 124 is inspected and electrically tested for identification of KGD post singulation.

FIGS. 4a-4d illustrate composite multilayer panels for use as carriers that include combinations of glass, fiber enhanced protection layers, and foil. FIG. 4a shows a cross-sectional view of a portion of a carrier or temporary substrate 160 containing base material 162 such as polycrystal silicon, low CTE polymer matrix composite, glass, or other suitable low-cost, rigid material for structural support. An interface layer or double-sided tape 164 is formed over carrier 160 as a temporary adhesive bonding film, etch-stop layer, or thermal release layer. Carrier 160 also includes fiber or filler enhanced support layer or composite layer 166 to control warpage and limit breakage.

Composite layer 166 includes one or more laminated layers of pre-impregnated (prepreg) with bismaleimide-triazine (BT), FR-4, FR-1, CEM-1, or CEM-3, or other material having similar insulating and structural properties. Composite layer 166 further includes an epoxy resin or polymer with a reinforcement fiber or fabric, such as phenolic cotton paper, epoxy, resin, woven glass, matte glass, polyester, and other reinforcement fibers or fabrics. In one embodiment, composite layer 166 is a prepreg sheet, roll, or tape including a polymer matrix enhanced with woven glass fiber and deposited using vacuum or pressure lamination with or without heat. The material selected for composite layer 166 enhances the overall strength of carrier 160 and reduces warpage of carrier 160 and the reconstituted wafer or panel formed over carrier 160. In one embodiment, carrier 160 includes glass as base material 162 with fiber or filler enhanced composite layer 166 bonded to a surface of the glass opposite tape 164. In one embodiment, composite multilayer panel or carrier 160 includes a glass base material augmented by a fiber enhanced protection layer such as prepreg, with or without copper foil, to protect the carrier from breakage.

FIG. 4b shows a cross-sectional view of a portion of a carrier or temporary substrate 170 containing base material 172 such as polycrystal silicon, polymer, glass, or other suitable low-cost, rigid material for structural support. Metal film 174 is bonded to base material 172. An interface layer or double-sided tape 176 is formed over base material 172 and metal film 174 as a temporary adhesive bonding film, etch-stop layer, or thermal release layer. Carrier 170 also includes fiber or filler enhanced composite layer 178 for support.

Composite layer 178 includes one or more laminated layers of prepreg with BT, FR-4, FR-1, CEM-1, or CEM-3, or other material having similar insulating and structural properties. Composite layer 178 further includes an epoxy resin or polymer with a reinforcement fiber or fabric, such as phenolic cotton paper, epoxy, resin, woven glass, matte glass, polyester, and other reinforcement fibers or fabrics. In one embodiment, composite layer 178 is a prepreg sheet, roll, or tape including a polymer matrix enhanced with woven glass fiber and deposited using vacuum or pressure lamination with or without heat. The material selected for composite layer 178 enhances the overall strength of carrier 170 and reduces warpage of carrier 170 and the reconstituted wafer or panel formed over carrier 170. In one embodiment, carrier 170 includes glass as base material 172 with fiber or filler enhanced composite layer 178 bonded to a surface of the glass opposite metal film 174 and tape 176. In one embodiment, composite multilayer panel or carrier 170 includes a glass base material augmented by a fiber enhanced protection layer such as prepreg, with or without copper foil, to protect the carrier from breakage.

FIG. 4c shows a cross-sectional view of a portion of a carrier or temporary substrate 180 containing base material 182 such as polycrystal silicon, polymer, glass, or other suitable low-cost, rigid material for structural support. A fiber or filler enhanced composite layer 184 is formed over base material 182 for support. Composite layer 184 includes one or more laminated layers of prepreg with BT, FR-4, FR-1, CEM-1, or CEM-3, or other material having similar insulating and structural properties. Composite layer 184 further includes an epoxy resin or polymer with a reinforcement fiber or fabric, such as phenolic cotton paper, epoxy, resin, woven glass, matte glass, polyester, and other reinforcement fibers or fabrics. In one embodiment, composite layer 184 is a prepreg sheet, roll, or tape including a polymer matrix enhanced with woven glass fiber and deposited using vacuum or pressure lamination with or without heat. The material selected for composite layer 184 enhances the overall strength of carrier 180 and reduces warpage of carrier 180 and the reconstituted wafer or panel formed over carrier 180.

A second layer of base material 186 is formed over composite layer 184 so that composite layer 184 is between base material 182 and base material 186. Base material 186 contains material such as polycrystal silicon, polymer, glass, or other suitable low-cost, rigid material for structural support. An interface layer or double-sided tape 188 is formed over base material 186 as a temporary adhesive bonding film, etch-stop layer, or thermal release layer. In one embodiment, carrier 180 includes glass as base material 182 and 186 with fiber or filler enhanced composite layer 184 bonded to surfaces of glass base material 186 and 182 to provide support. In one embodiment, composite multilayer panel or carrier 180 includes a glass base material augmented by a fiber enhanced protection layer such as prepreg, with or without copper foil, to protect the carrier from breakage.

FIG. 4d shows a cross-sectional view of a portion of a carrier or temporary substrate 190 containing base material 192 such as polycrystal silicon, polymer, glass, or other suitable low-cost, rigid material for structural support. Metal film 194 is bonded to a surface of base material 192. The bonding may or may not be visible. An interface layer or double-sided tape 196 is formed over base material 192 and metal film 194 as a temporary adhesive bonding film, etch-stop layer, or thermal release layer. Metal film 198 is bonded to a surface of base material 192 opposite metal film 194. In one embodiment, carrier 190 includes glass base material 192 with metal film 194 and tape 196 bonded over a first surface of glass base material 192 and metal film 198 bonded to a second surface opposite the first surface. The bonding may or may not be visible. In one embodiment, composite multilayer panel or carrier 190 includes a glass base material augmented by a fiber enhanced protection layer such as prepreg, with or without copper foil, to protect the carrier from breakage.

Figure 5A:
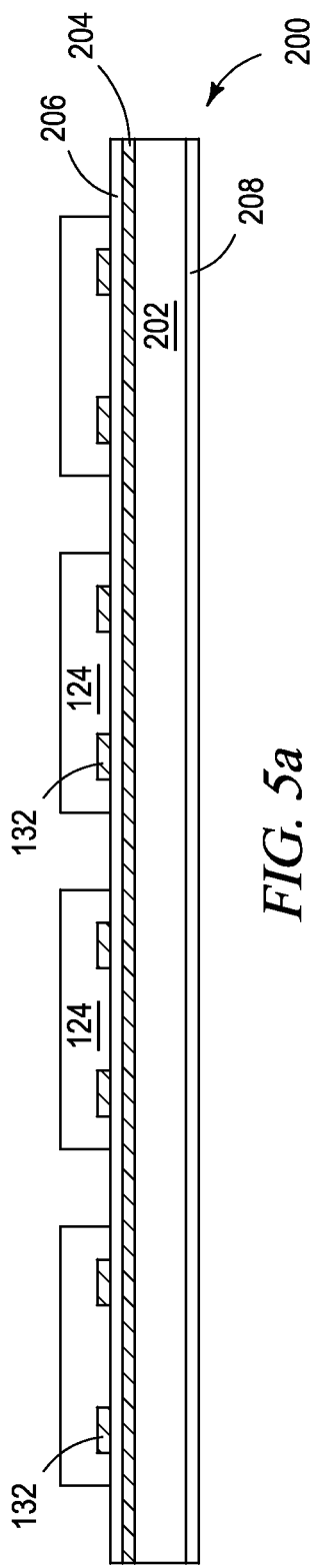

FIGS. 5a-5k show a process of forming a semiconductor device using a carrier and a dual-layer support structure with enhanced warpage control. In FIG. 5a, semiconductor die 124 from FIG. 3d are mounted to carrier 200. Carrier 200 is one of the carriers depicted in FIGS. 4a-4d or other variations with enhanced warpage control. Carrier 200 is depicted with base material 202 and metal film 204 deposited over base material 202. Interface layer or tape 206 is bonded to metal film 204. Composite layer 208 is bonded to the back surface of base material 202 to provide support and improve warpage characteristics. Semiconductor die 124 are mounted to carrier 200 and interface layer 206 using, for example, a pick and place operation with active surface 130 oriented toward the carrier.

Figure 5B:
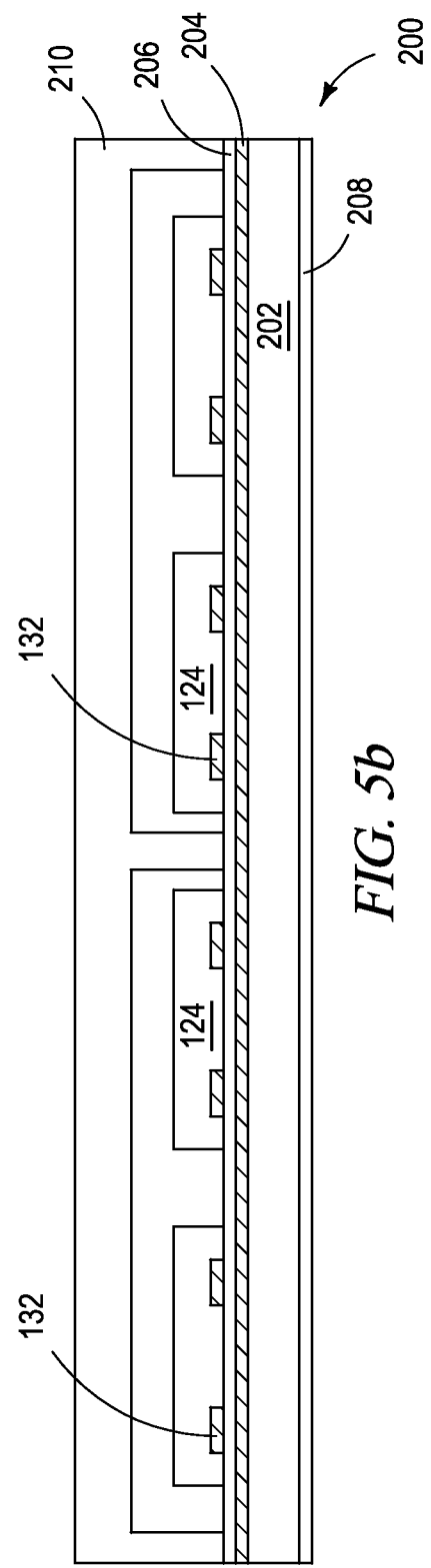

In FIG. 5b, chase mold 210 is disposed over semiconductor die 124 and carrier 200 to form chambers over semiconductor die 124. FIG. 5c shows an encapsulant or molding compound 212 deposited over and around semiconductor die 124 in chase mold 210 after the full closure of chase mold on interface layer 206. Encapsulant 212 is deposited over semiconductor die 124 using nozzle dispense or paste printing followed by compressive molding or vacuum molding. In particular, encapsulant 212 covers the four side surfaces and back surface 128 of semiconductor die 124 after molding. Encapsulant 212 is polymer composite material, such as epoxy resin with filler, epoxy acrylate with filler, or polymer with proper filler. Encapsulant 212 is non-conductive and environmentally protects the semiconductor die from external elements and contaminants. Encapsulant 212 also protects semiconductor die 124 from degradation due to exposure to light. In one embodiment, the thickness of encapsulant 212 over the back surface of semiconductor die 124 is 0.5 to 4 times the maximum filler cut of the encapsulant. The filler and coefficient of thermal expansion (CTE) of encapsulant 212 are selected to aid with gap filling, warpage control, adhesion to semiconductor die 124, adhesion to subsequent build up layers, and reliability.

In FIG. 5d, a support layer or composite layer 214 is formed conformally over encapsulant 212 to provide mechanical support and reduce warpage. Support layer 214 includes one or more laminated layers of prepreg with BT, FR-4, FR-1, CEM-1, or CEM-3, or other material having similar insulating and structural properties. Support layer 214 further includes an epoxy resin or polymer with a reinforcement fiber or fabric, such as phenolic cotton paper, epoxy, resin, woven glass, matte glass, polyester, and other reinforcement fibers or fabrics. In an alternative embodiment, support layer 214 contains a molding compound, polymer dielectric with or without fillers, one or more layers of SiO2, Si3N4, SiON, Ta2O5, Al2O3, or other material having similar insulating and structural properties. Support layer 214 is deposited using vacuum or pressure lamination with or without heat, PVD, CVD, screen printing, spin coating, spray coating, injection coating, sintering, thermal oxidation, or other suitable process. In one embodiment, support layer 214 is a prepreg sheet, roll, or tape including a polymer matrix enhanced with woven glass fiber and deposited using vacuum or pressure lamination with or without heat. The material selected for support layer 214 enhances the overall strength of the semiconductor package and improves package warpage. The material and thickness for support layer 214 are chosen to tune or select the CTE of panel 215 with support layer 214 including a CTE less than encapsulant 212. In one embodiment, support layer 214 has a CTE less than 10 parts per million per degree Celsius (ppm) and is less than 100 μm thick. An optional plasma or solvent cleaning step is carried out on encapsulant 212 prior to formation of support layer 214 over encapsulant 212.

In FIG. 5e, carrier 200 including base material 202, interface layer 204, and composite layer 206 are removed from panel 215 by chemical etching, mechanical peeling, chemical mechanical planarization (CMP), mechanical grinding, thermal bake, UV light, laser scanning, or wet stripping. Debonded panel 215 has a tuned CTE by including selected encapsulant 212, support layer 214, and thickness of die 124. Panel 215 with a properly tuned CTE has robust mechanical support to undergo further processing steps without a carrier.

FIG. 5f shows a cross section of panel 215 through encapsulant 212 and support layer 214. Panel 215 includes panel blocks 216. Each panel block 216 includes one or more semiconductor die or components 124. Panel blocks 216 can also include one or more packages within each block 216. Panel blocks 216 are formed with a gap between each panel block. In FIGS. 5e and 5f, the gap is completely filled with support layer 214 so that support layer 214 physically isolates encapsulant 212 of adjacent panels.

In FIG. 5g, an electrically conductive layer or redistribution layer (RDL) 220 is formed over the active surface of semiconductor die 124, encapsulant 212, and support layer 214 using a patterning and metal deposition process such as sputtering, electrolytic plating, or electroless plating. Conductive layer 220 is one or more layers of Al, Ti, TiW, Cu, Sn, Ni, Au, Ag, or other suitable electrically conductive material. One portion of conductive layer 220 is electrically connected to contact pads 132 of semiconductor die 124. Portions of conductive layer 220 are electrically common or electrically isolated depending on the design and function of semiconductor die 124. RDL 220 is formed over semiconductor die 124 in a fan-out configuration or a fan-in configuration.

An insulating or passivation layer 222 is formed over the active surface of semiconductor die 124, encapsulant 212, support layer 214, and conductive layer 220 using PVD, CVD, printing, slit coating, spin coating, spray coating, injection coating, lamination, sintering, or thermal oxidation. The insulating layer 222 contains one or more layers of SiO2, Si3N4, SiON, Ta2O5, Al2O3, polymer dielectric resist with or without fillers or fibers, or other material having similar structural and insulating properties. In FIG. 5h, opening 224 is formed by removing a portion of insulating layer 222 using an exposure or development process, laser direct ablation (LDA), etching, or other suitable process to expose conductive layer 220.

Figure 5I:
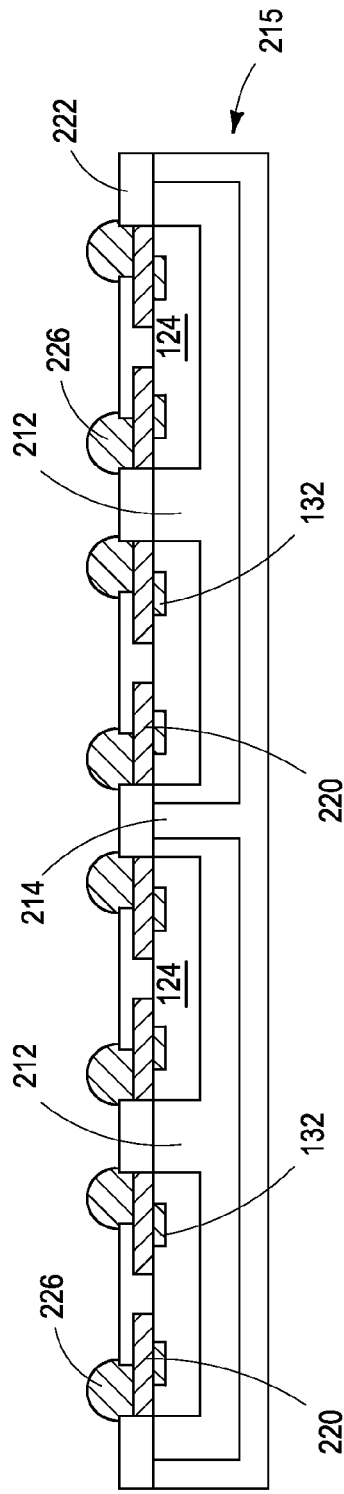

In FIG. 5i, an electrically conductive bump material is deposited over the build-up interconnect structure and electrically connected to the exposed portion of conductive layer 220 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 220 using a suitable attachment or bonding process. In one embodiment, the bump material is reflowed by heating the material above its melting point to form spherical balls or bumps 226. In some applications, bumps 226 are reflowed a second time to improve electrical contact to conductive layer 220. An under bump metallization (UBM) is formed under bumps 226. Bumps 226 can also be compression bonded to conductive layer 220. Bumps 226 represent one type of interconnect structure that can be formed over conductive layer 220. The interconnect structure can also use stud bump, micro bump, or other electrical interconnect.

Figure 5J:
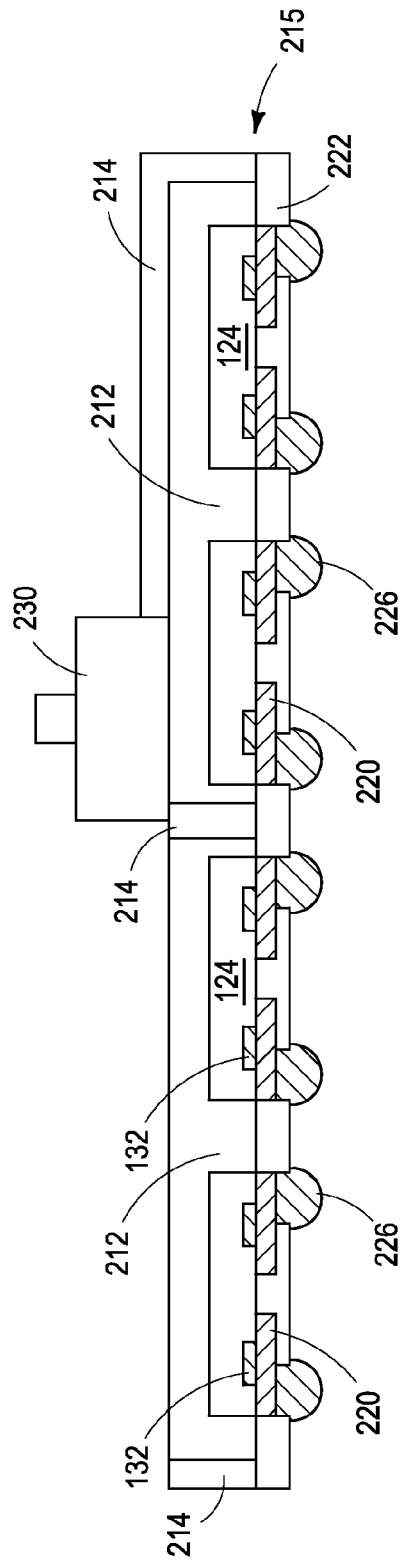

In FIG. 5j, a backside surface of encapsulant 212 undergoes an optional grinding operation with grinder 230 to planarize and reduce a thickness of support layer 214, encapsulant 212, and semiconductor die 124. The grinding operation removes a portion of encapsulant 212 and support layer 214. In one embodiment, encapsulant material is removed down to back surface 128 of semiconductor die 124. A chemical etch can also be used to planarize and remove a portion of encapsulant 212 and semiconductor die 124. A chemical etch, CMP, or plasma dry etch can also be used to remove back grinding damage and reduce stress on semiconductor die 124 and encapsulant 212 to enhance the package strength. In one embodiment, encapsulant 212 and support layer 214 remain over semiconductor die 124 after back grinding.

Figure 5K:
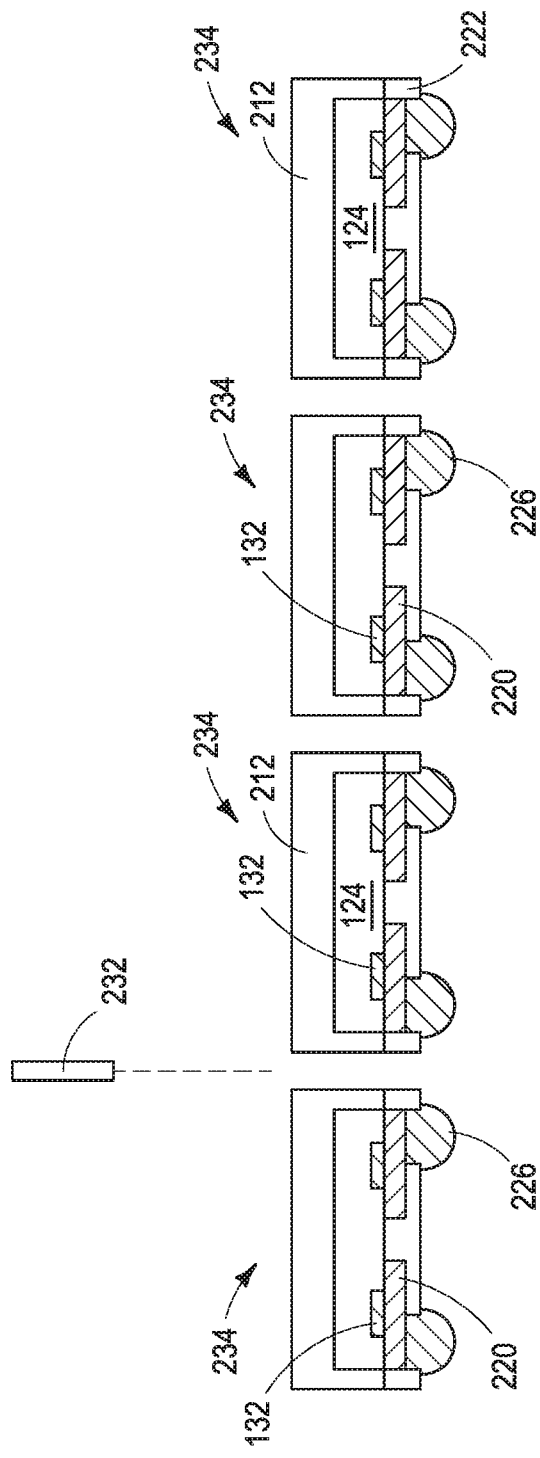

After back grinding, reconstituted wafer or panel 215 is singulated as shown in FIG. 5k using a saw blade or laser cutting tool 232 to form individual semiconductor packages or semiconductor devices 234. Semiconductor packages 232 are embedded wafer level ball grid array (eWLB) packages or eWLCSP packages. Packages 234 can include fan-out or fan-in interconnect structures. By forming semiconductor packages 234 with panel 215 and panel blocks 216 the warpage characteristics of panel 215 during processing are improved. Panel 215 with wafer shape reduces breakage and supports semiconductor devices 234 during formation of interconnect structures by using a dual-layer support structure.

Figure 6D:
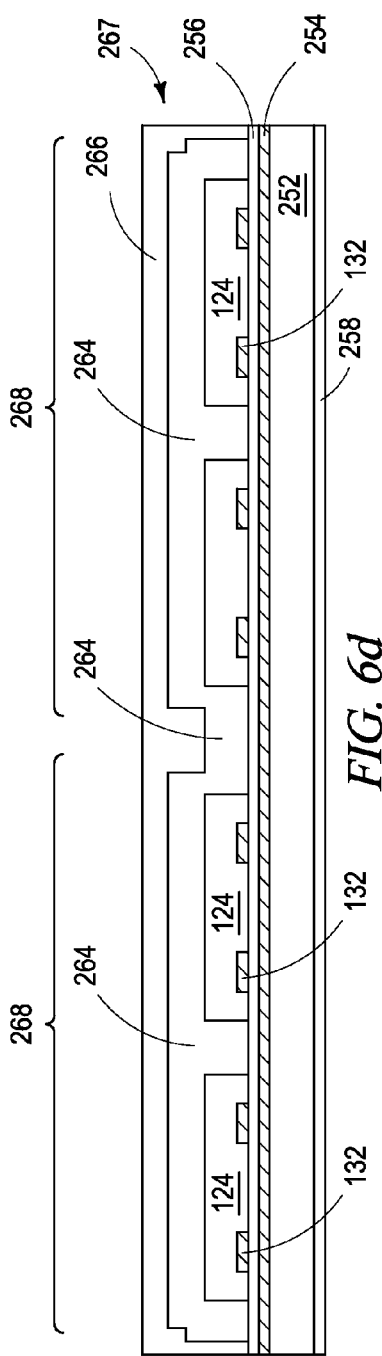

FIGS. 6a-6k show a process of forming a semiconductor device using a carrier and a dual-layer support structure with enhanced warpage control. In FIG. 6a, semiconductor die 124 from FIG. 3d are mounted to carrier 250. Carrier 250 is any carrier depicted in FIGS. 4a-4d or another variation with enhanced warpage control. Carrier 250 is depicted with base material 252 and metal film 254 deposited over base material 252. Interface layer or tape 256 is bonded to metal film 254. Composite layer 258 is bonded to the back surface of base material 252 to provide support and improve warpage characteristics. Semiconductor die 124 are mounted to carrier 250 and interface layer 256 using, for example, a pick and place operation with active surface 130 oriented toward the carrier.

In FIG. 6b, chase mold 260 is disposed over semiconductor die 124 and carrier 250 to form chambers over semiconductor die 124 with opening 262 between semiconductor die 124. FIG. 6c shows an encapsulant or molding compound 264 deposited over and around semiconductor die 124 in chase mold 260 after the full closure of chase mold on interface layer 256. Encapsulant 264 is deposited over semiconductor die 124 using nozzle dispense or paste printing followed by compressive molding or vacuum molding. In particular, encapsulant 264 covers the four side surfaces and back surface 128 of semiconductor die 124. Encapsulant 264 is polymer composite material, such as epoxy resin with filler, epoxy acrylate with filler, or polymer with proper filler. Encapsulant 264 is non-conductive and environmentally protects the semiconductor die from external elements and contaminants. Encapsulant 264 also protects semiconductor die 124 from degradation due to exposure to light. In one embodiment, the thickness of encapsulant 264 over the back surface of semiconductor die 124 is 0.5 to 4 times the maximum filler cut of the encapsulant. The filler and CTE of encapsulant 264 are selected to aid with gap filling, warpage control, and reliability.

In FIG. 6d, a support layer or composite layer 266 is formed over encapsulant 264. Support layer 266 includes one or more laminated layers of prepreg with BT, FR-4, FR-1, CEM-1, or CEM-3, or other material having similar insulating and structural properties. Support layer 266 further includes an epoxy resin or polymer with a reinforcement fiber or fabric, such as phenolic cotton paper, epoxy, resin, woven glass, matte glass, polyester, and other reinforcement fibers or fabrics. In an alternative embodiment, support layer 266 contains a molding compound, polymer dielectric with or without fillers, one or more layers of SiO2, Si3N4, SiON, Ta2O5, Al2O3, or other material having similar insulating and structural properties. Support layer 266 is deposited using vacuum or pressure lamination with or without heat, PVD, CVD, screen printing, spin coating, spray coating, injection coating, sintering, thermal oxidation, or other suitable process. In one embodiment, support layer 266 is a prepreg sheet, roll, or tape including a polymer matrix enhanced with woven glass fiber and deposited using vacuum or pressure lamination with or without heat. The material selected for support layer 266 enhances the overall strength of the semiconductor package and improves package warpage. The material for support layer 266 is selected to tune the CTE of panel 267. In one embodiment, support layer 266 has a CTE less than 10 ppm and is less than 100 µm thick. An optional plasma or solvent cleaning step is carried out on encapsulant 264 prior to formation of support layer 266 over encapsulant 264.

Figure 6E:
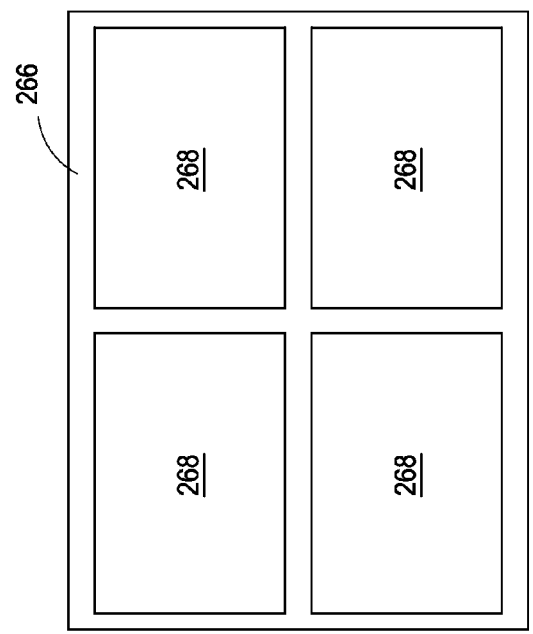
Figure 6F:
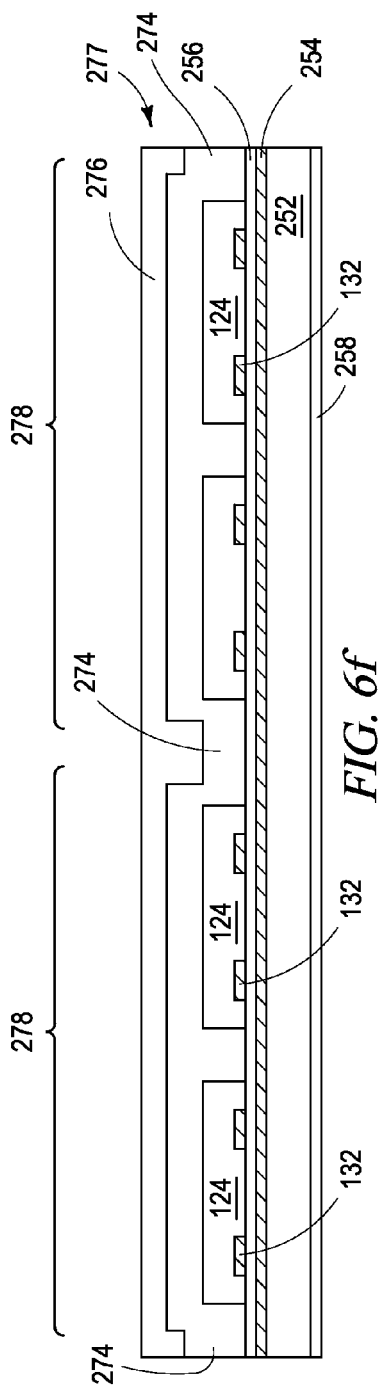

FIG. 6e shows a cross section of panel 267 through encapsulant 264 and support layer 266. Panel 267 includes panel blocks 268. Each panel block 268 includes one or more semiconductor die or components 124. Panel blocks 268 can also include one or more packages within each block 268. Panel blocks 268 are formed with gap or opening 262 between each panel block. In FIGS. 6e and 6f, gap or opening 262 is filled with encapsulant 264 so that encapsulant 264 extends between adjacent panel blocks 268. The portion of encapsulant 264 in gap or opening 262 has a height less than a height of the portion of encapsulant 264 over in panel blocks 268. Panel 267 of FIG. 6e includes four or more separate panel blocks 268 with gap 262 between each panel block 268 filled with encapsulant 264.

In FIG. 6f, an insulating or composite layer 276 is formed over encapsulant 274. Support layer 276 includes one or more laminated layers of prepreg with BT, FR-4, FR-1, CEM-1, or CEM-3, or other material having similar structural properties. Support layer 276 further includes an epoxy resin or polymer with a reinforcement fiber or fabric, such as phenolic cotton paper, epoxy, resin, woven glass, matte glass, polyester, and other reinforcement fibers or fabrics. In an alternative embodiment, support layer 276 contains a molding compound, polymer dielectric with or without fillers, one or more layers of SiO2, Si3N4, SiON, Ta2O5, Al2O3, or other material having similar insulating and structural properties. Support layer 276 is deposited using vacuum or pressure lamination with or without heat, PVD, CVD, screen printing, spin coating, spray coating, injection coating, sintering, thermal oxidation, or other suitable process. In one embodiment, support layer 276 is a prepreg sheet, roll, or tape including a polymer matrix enhanced with woven glass fiber and deposited using vacuum or pressure lamination with or without heat. The material selected for support layer 276 enhances the overall strength of the semiconductor package and improves package warpage. The material for support layer 276 is selected to tune the CTE of panel 277. In one embodiment, support layer 276 has a CTE less than 10 ppm and is less than 100 μm thick. An optional plasma or solvent cleaning step is carried out on encapsulant 274 prior to formation of support layer 276 over encapsulant 274.

Figure 6G:
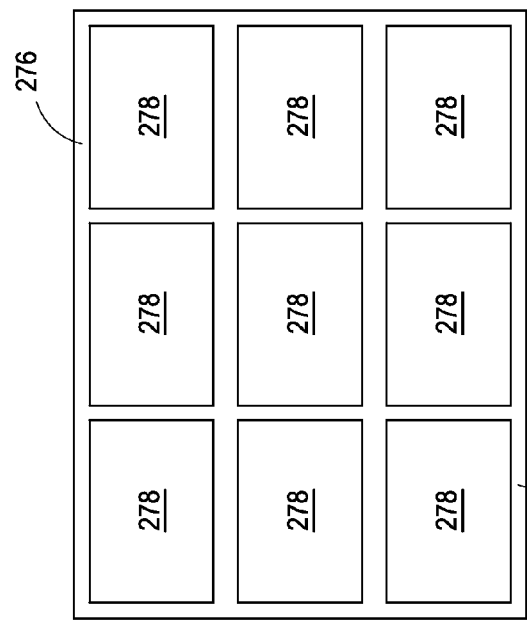

FIG. 6g shows panel 277 including panel blocks 278. Each panel block 278 includes one or more semiconductor die or components 124. Panel blocks 278 can also include one or more packages within each panel block 278. Panel blocks 278 are formed with a gap or opening between each panel block. The gap or opening is filled with encapsulant 274 so that encapsulant 274 extends between adjacent panel blocks 278 with the portion of encapsulant 274 in the gap or opening thinner than the portion of encapsulant 274 over in panel blocks 278. Panel 277 of FIG. 6e includes at least nine separate panel blocks 278 with the opening between each panel block 278 filled with encapsulant 274. Panel 277 is formed with more or fewer panel blocks 278 as necessary.

In FIG. 6h, continuing from FIG. 6d, carrier 250 including base material 252, interface layer 256, and composite layer 254 are removed from panel 267 by chemical etching, mechanical peeling, chemical mechanical planarization (CMP), mechanical grinding, thermal bake, UV light, laser scanning, or wet stripping. Debonded panel 267 has a tuned CTE by including selected encapsulant 264, support layer 266, and thickness of die 124. Panel 267 with a properly tuned CTE has robust mechanical support to undergo further processing steps without a carrier.

An electrically conductive layer or RDL 282 is formed over the active surface of semiconductor die 124, encapsulant 264, and support layer 266 using a patterning and metal deposition process such as sputtering, electrolytic plating, or electroless plating. Conductive layer 282 is one or more layers of Al, Ti, TiW, Cu, Sn, Ni, Au, Ag, or other suitable electrically conductive material. One portion of conductive layer 282 is electrically connected to contact pads 132 of semiconductor die 124. Portions of conductive layer 282 are electrically common or electrically isolated depending on the design and function of semiconductor die 124.

An insulating or passivation layer 284 is formed over the active surface of semiconductor die 124, encapsulant 264, support layer 266, and conductive layer 282 using PVD, CVD, printing, slit coating, spin coating, spray coating, injection coating, lamination, sintering, or thermal oxidation. Support layer 266 contains one or more layers of SiO2, Si3N4, SiON, Ta2O5, Al2O3, polymer dielectric resist with or without fillers or fibers, or other material having similar structural and insulating properties. In FIG. 6h, opening 286 is formed by removing a portion of insulating layer 284 using an exposure or development process, LDA, etching, or other suitable process to expose conductive layer 282.

In FIG. 6i, an electrically conductive bump material is deposited over the build-up interconnect structure and electrically connected to the exposed portion of conductive layer 282 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 282 using a suitable attachment or bonding process. In one embodiment, the bump material is reflowed by heating the material above its melting point to form spherical balls or bumps 288. In some applications, bumps 288 are reflowed a second time to improve electrical contact to conductive layer 282. An under bump metallization is formed under bumps 288. Bumps 288 can also be compression bonded to conductive layer 282. Bumps 288 represent one type of interconnect structure that is formed over conductive layer 282. The interconnect structure can also use stud bump, micro bump, or other electrical interconnect.

Figure 6J:
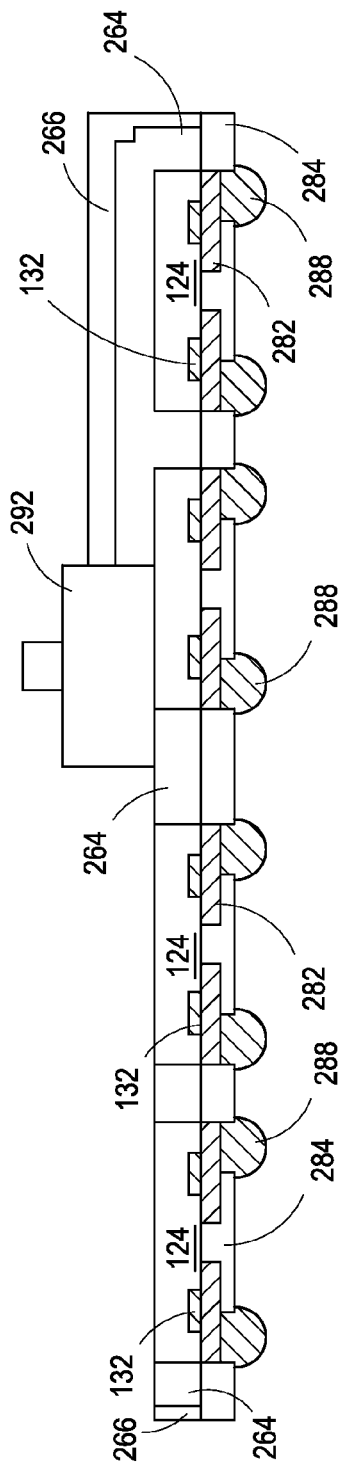
Figure 6K:
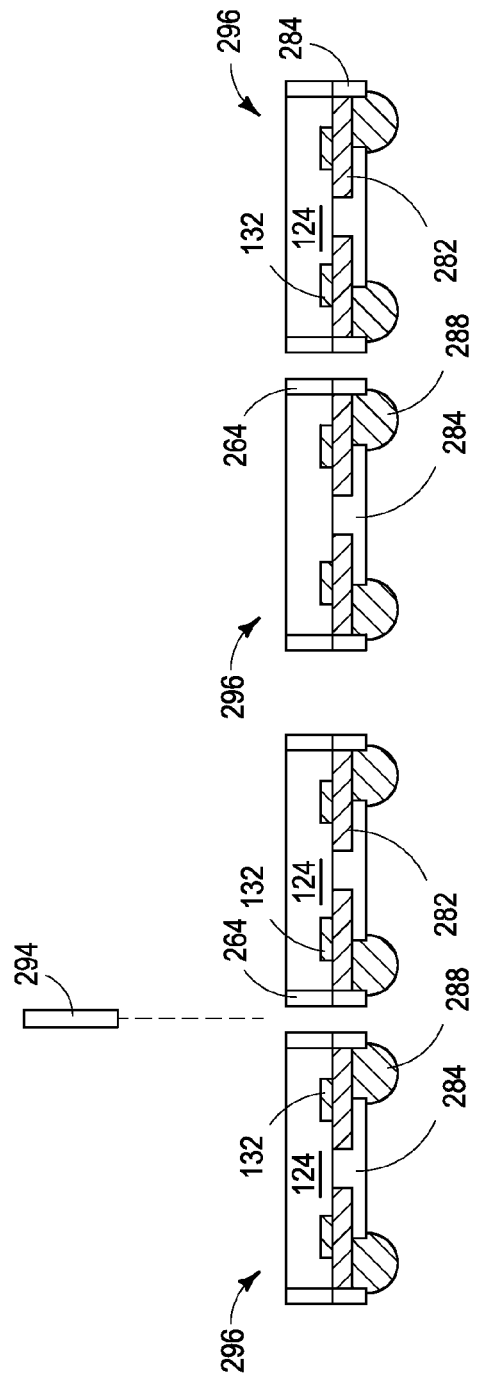

In FIG. 6j, backside surface of encapsulant 264 undergoes an optional grinding operation with grinder 292 to planarize and reduce a thickness of support layer 266, encapsulant 264, and semiconductor die 124. The grinding operation removes a portion of encapsulant 264 and support layer 266. In one embodiment, encapsulant material is removed down to back surface 128 of semiconductor die 124. A chemical etch can also be used to planarize and remove a portion of encapsulant 264 and semiconductor die 124. A chemical etch, CMP, or plasma dry etch can also be used to remove back grinding damage and reduce stress on semiconductor die 124 and encapsulant 264 to enhance the package strength. In one embodiment, encapsulant 264 and support layer 266 remain over semiconductor die 124 after back grinding. After back grinding, reconstituted wafer or panel 267 is singulated as shown in FIG. 6k using a saw blade or laser cutting tool 294 to form individual semiconductor packages 296. Semiconductor packages 296 are eWLB packages or eWLCSP packages.

FIGS. 7a-7d illustrate a process of forming a semiconductor device using a carrier and dual-layer support structure with enhanced warpage control continuing from FIG. 6f. In FIG. 7a, carrier 250 including base material 252, interface layer 256, and composite layer 254 are removed from panel 277 by chemical etching, mechanical peeling, chemical mechanical planarization (CMP), mechanical grinding, thermal bake, UV light, laser scanning, or wet stripping. Debonded panel 277 has a tuned CTE by including selected encapsulant 274, support material 276, and thickness of die 124. Panel 277 with a properly tuned CTE has robust mechanical support to undergo further processing steps without a carrier.

A semiconductor die 124 is disposed over a temporary substrate or carrier 300, similar to carrier 250 in FIG. 6a, with active surface 130 of semiconductor die 124 oriented away from the carrier. Carrier 300 includes a base material 302 such as polycrystal silicon, polymer, glass, or other suitable low-cost, rigid material for structural support. Interface layer or double-sided tape 304, similar to interface layer 256 in FIG. 6a, is formed over the carrier as a temporary adhesive bonding film, etch-stop layer, or thermal release layer. In one embodiment, base material 302 is glass, with the CTE of encapsulant 274, insulating layer 276, and glass 302 tuned to support panel 277 during subsequent processing steps with improved warpage control and reduced breakage.

In FIG. 7b, an electrically conductive layer or RDL 310 is formed over the active surface of semiconductor die 124, encapsulant 274, and insulating layer 276 using a patterning and metal deposition process such as sputtering, electrolytic plating, or electroless plating. Conductive layer 310 includes one or more layers of Al, Ti, TiW, Cu, Sn, Ni, Au, Ag, or other suitable electrically conductive material. One portion of conductive layer 310 is electrically connected to contact pads 132 of semiconductor die 124. Portions of conductive layer 310 are electrically common or electrically isolated depending on the design and function of semiconductor die 124.

An insulating or passivation layer 312 is formed over the active surface of semiconductor die 124, encapsulant 274, insulating layer 276, and conductive layer 310 using PVD, CVD, printing, slit coating, spin coating, spray coating, injection coating, lamination, sintering, or thermal oxidation. Insulating layer 276 contains one or more layers of SiO2, Si3N4, SiON, Ta2O5, Al2O3, polymer dielectric resist with or without fillers or fibers, or other material having similar structural and insulating properties. An opening is formed by removing a portion of insulating layer 312 using an exposure or development process, LDA, etching, or other suitable process to expose conductive layer 310.

An electrically conductive bump material is deposited over the build-up interconnect structure and electrically connected to the exposed portion of conductive layer 310 using an evaporation, electrolytic plating, electroless plating, ball drop, or screen printing process. The bump material includes Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 310 using a suitable attachment or bonding process. In one embodiment, the bump material is reflowed by heating the material above its melting point to form spherical balls or bumps 314. In some applications, bumps 314 are reflowed a second time to improve electrical contact to conductive layer 310. An under bump metallization is formed under bumps 314. Bumps 314 can also be compression bonded to conductive layer 310. Bumps 314 represent one type of interconnect structure that can be formed over conductive layer 310. The interconnect structure can also use stud bump, micro bump, or other electrical interconnect.

In FIG. 7c, carrier 300 including base material 302 and interface layer 304 are removed from panel 277 by chemical etching, mechanical peeling, chemical mechanical planarization (CMP), mechanical grinding, thermal bake, UV light, laser scanning, or wet stripping. Debonded panel 277 has a tuned CTE by including selected encapsulant 274, insulating layer 276, and thickness of die 124.

A backside surface of encapsulant 274 undergoes a grinding operation with grinder 320 to planarize and reduce a thickness of insulating layer 276, encapsulant 274, and semiconductor die 124. The grinding operation removes a portion of encapsulant 274 and insulating layer 276. In one embodiment, encapsulant material is removed down to back surface 128 of semiconductor die 124. A chemical etch can also be used to planarize and remove a portion of encapsulant 274 and semiconductor die 124. A chemical etch, CMP, or plasma dry etch can also be used to remove back grinding damage and reduce stress on semiconductor die 124 and encapsulant 274 to enhance the package strength. In one embodiment, encapsulant 274 and insulating layer 276 remain over semiconductor die 124 after back grinding. After back grinding, reconstituted wafer or panel 277 is singulated as shown in FIG. 7d using a saw blade or laser cutting tool 322 to form individual semiconductor packages 324. Semiconductor packages 324 are eWLB packages or eWLCSP packages.

Figure 8D:
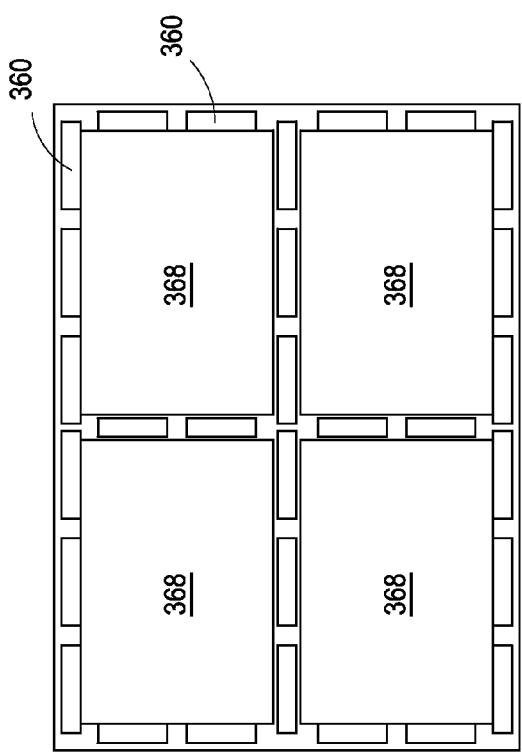

FIGS. 8a-8g show a process of forming a semiconductor device using a carrier with enhanced warpage control. In FIG. 8a, semiconductor die 124 from FIG. 3d are mounted to carrier 350. Carrier 350 is any carrier depicted in FIGS. 4a-4d or another variation with enhanced warpage control. Carrier 350 is depicted with base material 352 and metal film 354 deposited over base material 352. Interface layer or tape 356 is bonded to metal film 354. Composite layer 358 is bonded to the back surface of base material 352 to provide support and improve warpage characteristics.

Semiconductor die 124 are mounted to carrier 350 and interface layer 356 using, for example, a pick and place operation with active surface 130 oriented toward the carrier. Frame support bars or support members 360 are mounted on or disposed over carrier 350 between semiconductor die 124 of adjacent panel blocks 368 and around each panel block 368 using a pick and place operation, for example. Support members 360 provide structural support and balance warpage. Support members 360 are made from material such as plastic with a high CTE or printed circuit board base material. In one embodiment, the CTE of support member 360 is greater than the CTE of encapsulant 364, which is greater than or equal to the CTE of insulating layer 366. Support member 360 has a height less than or equal to the height of semiconductor die 124.

FIGS. 8b and 8c show an encapsulant or molding compound 364 deposited over and around semiconductor die 124 and support member 360. Encapsulant 364 is deposited using a paste printing, compressive molding, transfer molding, liquid encapsulant molding, vacuum lamination, spin coating, or other suitable applicator. In particular, encapsulant 364 covers the four side surfaces and back surface 128 of semiconductor die 124 and support member 360. Encapsulant 364 is polymer composite material, such as epoxy resin with filler, epoxy acrylate with filler, or polymer with proper filler. Encapsulant 364 is non-conductive and environmentally protects the semiconductor die from external elements and contaminants. Encapsulant 364 also protects semiconductor die 124 from degradation due to exposure to light. In one embodiment, the thickness of encapsulant 364 over the back surface of semiconductor die 124 is 0.5 to 4 times the maximum filler cut of the encapsulant. The filler and CTE of encapsulant 364 are selected to aid with gap filling, warpage control, and reliability.

An insulating or composite layer 366 is formed over encapsulant 364. Insulating layer 366 includes one or more laminated layers of prepreg with BT, FR-4, FR-1, CEM-1, or CEM-3, or other material having similar insulating and structural properties. Insulating layer 366 further includes an epoxy resin or polymer with a reinforcement fiber or fabric, such as phenolic cotton paper, epoxy, resin, woven glass, matte glass, polyester, and other reinforcement fibers or fabrics. In an alternative embodiment, insulating layer 366 contains a molding compound, polymer dielectric with or without fillers, one or more layers of SiO2, Si3N4, SiON, Ta2O5, Al2O3, or other material having similar insulating and structural properties. Insulating layer 366 is deposited using vacuum or pressure lamination with or without heat, PVD, CVD, screen printing, spin coating, spray coating, injection coating, sintering, thermal oxidation, or other suitable process. In one embodiment, insulating layer 366 is a prepreg sheet, roll, or tape including a polymer matrix enhanced with woven glass fiber and deposited using vacuum or pressure lamination with or without heat. The material selected for insulating layer 366 enhances the overall strength of the semiconductor package and improves package warpage. The material for insulating layer 366 is selected to tune the CTE of panel 367. In one embodiment, insulating layer 366 has a CTE less than 10 ppm and is less than 100 μm thick. An optional plasma or solvent cleaning step is carried out on encapsulant 364 prior to formation of insulating layer 366 over encapsulant 364.

FIG. 8d shows a cross section of panel 367 through encapsulant 364 and support members 360. Panel 367 includes panel blocks 368. Each panel block 368 includes one or more semiconductor die or components 124 and support members 360 around or within the panel block. Panel blocks 368 can also include one or more packages within each block 368. Panel blocks 368 are formed with a space or opening separating each panel block. A support member 360 extends between panel blocks 368 within the opening. Support member 360 is a broken or closed rectangular, circular, or other shape when viewed from above and is shown as a broken rectangular shape in FIG. 8d.

Figure 8E:
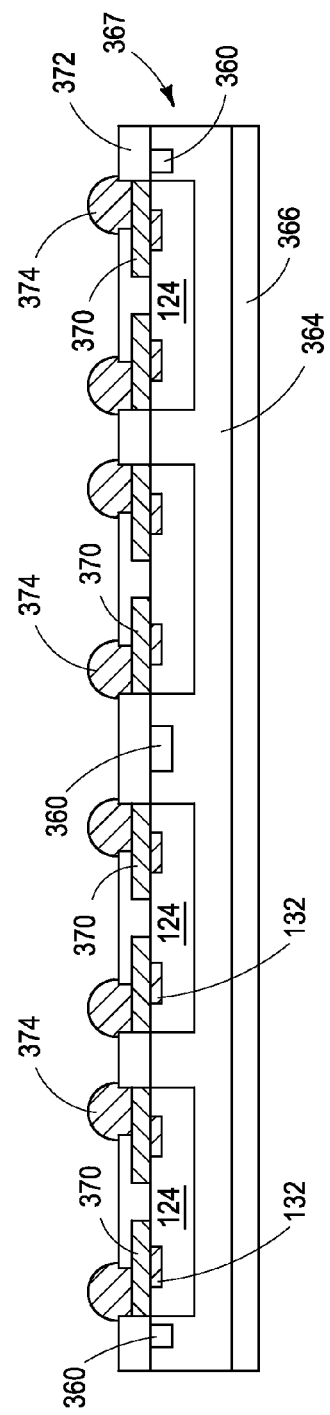

In FIG. 8e, carrier 350 including base material 352, interface layer 356, and composite layer 358 are removed from panel 367 by chemical etching, mechanical peeling, chemical mechanical planarization (CMP), mechanical grinding, thermal bake, UV light, laser scanning, or wet stripping. Debonded panel 367 has a tuned CTE by including selected encapsulant 364, support material 366, support member 360, and thickness of die 124. Panel 367 with a properly tuned CTE has robust mechanical support to undergo further processing steps without a carrier.

An electrically conductive layer or RDL 370 is formed over the active surface of semiconductor die 124, encapsulant 364, and insulating layer 366 using a patterning and metal deposition process such as sputtering, electrolytic plating, or electroless plating. Conductive layer 370 is one or more layers of Al, Ti, TiW, Cu, Sn, Ni, Au, Ag, or other suitable electrically conductive material. One portion of conductive layer 370 is electrically connected to contact pads 132 of semiconductor die 124. Portions of conductive layer 370 are electrically common or electrically isolated depending on the design and function of semiconductor die 124.

An insulating or passivation layer 372 is formed over the active surface of semiconductor die 124, encapsulant 364, insulating layer 366, and conductive layer 370 using PVD, CVD, printing, slit coating, spin coating, spray coating, injection coating, lamination, sintering, or thermal oxidation. The insulating layer 372 contains one or more layers of SiO2, Si3N4, SiON, Ta2O5, Al2O3, polymer dielectric resist with or without fillers or fibers, or other material having similar structural and insulating properties. An opening is formed by removing a portion of insulating layer 372 using an exposure or development process, LDA, etching, or other suitable process to expose conductive layer 370.

An electrically conductive bump material is deposited over the build-up interconnect structure and electrically connected to the exposed portion of conductive layer 370 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 374. In some applications, bumps 374 are reflowed a second time to improve electrical contact to conductive layer 370. An under bump metallization is formed under bumps 374. Bumps 374 can also be compression bonded to conductive layer 370. Bumps 374 represent one type of interconnect structure that can be formed over conductive layer 370. The interconnect structure can also use stud bump, micro bump, or other electrical interconnect.

Figure 8F:
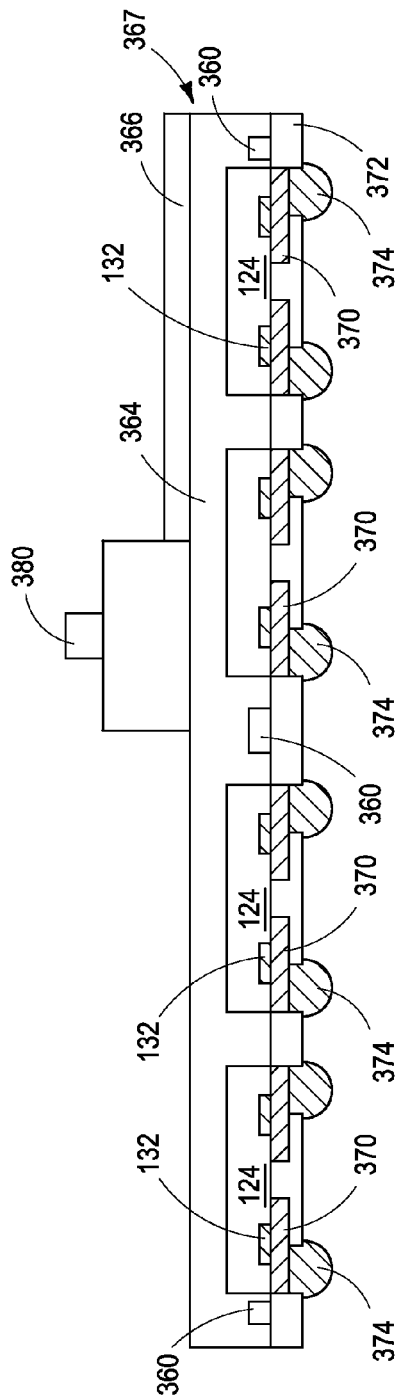
Figure 8G:
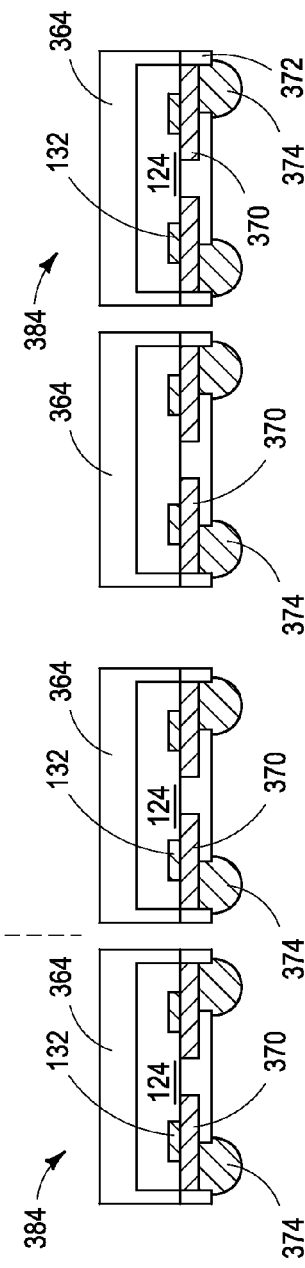

In FIG. 8f, a backside surface of encapsulant 364 undergoes an optional grinding operation with grinder 380 to planarize and reduce a thickness of insulating layer 366, encapsulant 364, and semiconductor die 124. The grinding operation removes a portion of encapsulant 364 and insulating layer 366. In one embodiment, encapsulant material is removed down to back surface 128 of semiconductor die 124. A chemical etch can also be used to planarize and remove a portion of encapsulant 364 and semiconductor die 124. A chemical etch, CMP, or plasma dry etch can also be used to remove back grinding damage and reduce stress on semiconductor die 124 and encapsulant 364 to enhance the package strength. In one embodiment, encapsulant 364 and insulating layer 366 remain over semiconductor die 124 after back grinding. After back grinding, reconstituted wafer or panel 367 is singulated as shown in FIG. 8g using a saw blade or laser cutting tool 382 to form individual semiconductor packages 384. Semiconductor packages 384 are eWLB packages or eWLCSP packages.

Figure 9D:
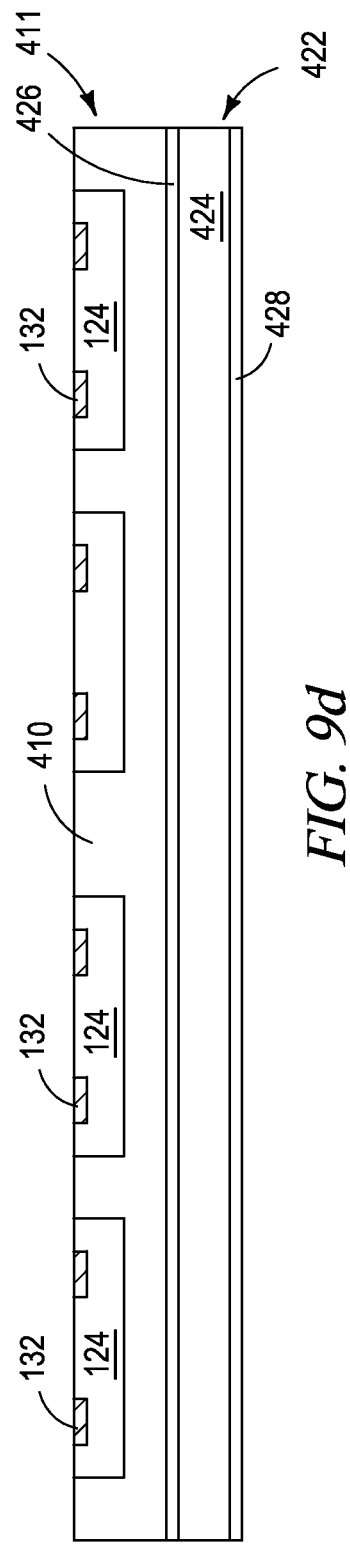

FIGS. 9a-9g show a process of forming a semiconductor device using a carrier and panel with enhanced warpage control. In FIG. 9a, semiconductor die 124 from FIG. 3d are mounted to carrier 400. Carrier 400 is any carrier depicted in FIGS. 4a-4d or another variation with enhanced warpage control. Carrier 400 is depicted with base material 402 and metal film 404 deposited over base material 402. Interface layer or tape 406 is bonded to metal film 404. Composite layer 408 is bonded to the back surface of base material 402 to provide support and improve warpage characteristics. Semiconductor die 124 are mounted to carrier 400 and interface layer 406 using, for example, a pick and place operation with active surface 130 oriented toward the carrier.

FIG. 9b shows an encapsulant or molding compound 410 deposited over and around semiconductor die 124. Encapsulant 410 is deposited using a paste printing, compressive molding, transfer molding, liquid encapsulant molding, vacuum lamination, spin coating, or other suitable applicator. In particular, encapsulant 410 covers the four side surfaces and back surface 128 of semiconductor die 124. Encapsulant 410 is polymer composite material, such as epoxy resin with filler, epoxy acrylate with filler, or polymer with proper filler. Encapsulant 410 is non-conductive and environmentally protects the semiconductor die from external elements and contaminants. Encapsulant 410 also protects semiconductor die 124 from degradation due to exposure to light. In one embodiment, the thickness of encapsulant 410 over the back surface of semiconductor die 124 is 0.5 to 4 times the maximum filler cut of the encapsulant. The filler and CTE of encapsulant 410 are selected to aid with gap filling, warpage control, and reliability.

In FIG. 9c, carrier 400 including base material 402, interface layer 406, and composite layer 408 are removed from panel 411 by chemical etching, mechanical peeling, chemical mechanical planarization (CMP), mechanical grinding, thermal bake, UV light, laser scanning, or wet stripping. Debonded panel 411 has a tuned CTE by including selected encapsulant 410 and thickness of die 124. Panel 411 with a properly tuned CTE has robust mechanical support to undergo further processing steps without a carrier. Panel 411 is placed over a second carrier 412 with active surface 130 of semiconductor die 124 oriented away from carrier 412. Carrier 412 includes base material 414, composite layer or insulating layer 416 formed over base material 414, and adhesive or interface layer 418 formed over insulating layer 416. In one embodiment, base material 414 is glass and insulating layer 416 is prepreg. FIG. 9d shows another embodiment including a second carrier configured to reduce warpage and breakage during processing. Panel 411 is placed over a second carrier 422 with active surface 130 of semiconductor die 124 oriented away from carrier 422. Carrier 422 includes base material 424, interface layer 426 formed over base material 424, and composite insulating layer 428 formed over base material 424 opposite interface 426. In one embodiment, base material 414 is glass and composite layer 428 is prepreg material.

Figure 9E:
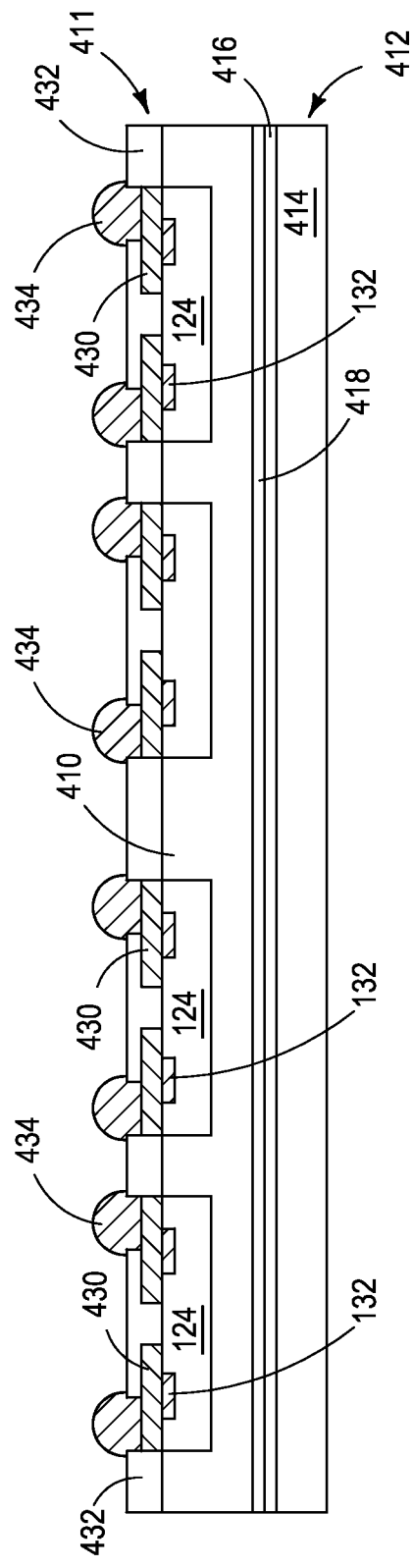

In FIG. 9e, an electrically conductive layer or RDL 430 is formed over the active surface of semiconductor die 124 and encapsulant 410 using a patterning and metal deposition process such as sputtering, electrolytic plating, or electroless plating. Conductive layer 430 is one or more layers of Al, Ti, TiW, Cu, Sn, Ni, Au, Ag, or other suitable electrically conductive material. One portion of conductive layer 430 is electrically connected to contact pads 132 of semiconductor die 124. Portions of conductive layer 430 are electrically common or electrically isolated depending on the design and function of semiconductor die 124.

An insulating or passivation layer 432 is formed over the active surface of semiconductor die 124, encapsulant 410, and conductive layer 430 using PVD, CVD, printing, slit coating, spin coating, spray coating, injection coating, lamination, sintering, or thermal oxidation. The insulating layer 432 contains one or more layers of $SiO_2$, $Si_3N_4$, SiON, $Ta_2O_5$, $Al_2O_3$, polymer dielectric resist with or without fillers or fibers, or other material having similar structural and insulating properties. An opening is formed by removing a portion of insulating layer 432 using an exposure or development process, LDA, etching, or other suitable process to expose conductive layer 430.

An electrically conductive bump material is deposited over the build-up interconnect structure and electrically connected to the exposed portion of conductive layer 430 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 430 using a suitable attachment or bonding process. In one embodiment, the bump material is reflowed by heating the material above its meltingpoint to form spherical balls or bumps 434. In some applications, bumps 434 are reflowed a second time to improve electrical contact to conductive layer 430. An under bump metallization is formed under bumps 434. Bumps 434 can also be compression bonded to conductive layer 430. Bumps 434 represent one type of interconnect structure that can be formed over conductive layer 430. The interconnect structure can also use stud bump, micro bump, or other electrical interconnect.

Figure 9F:
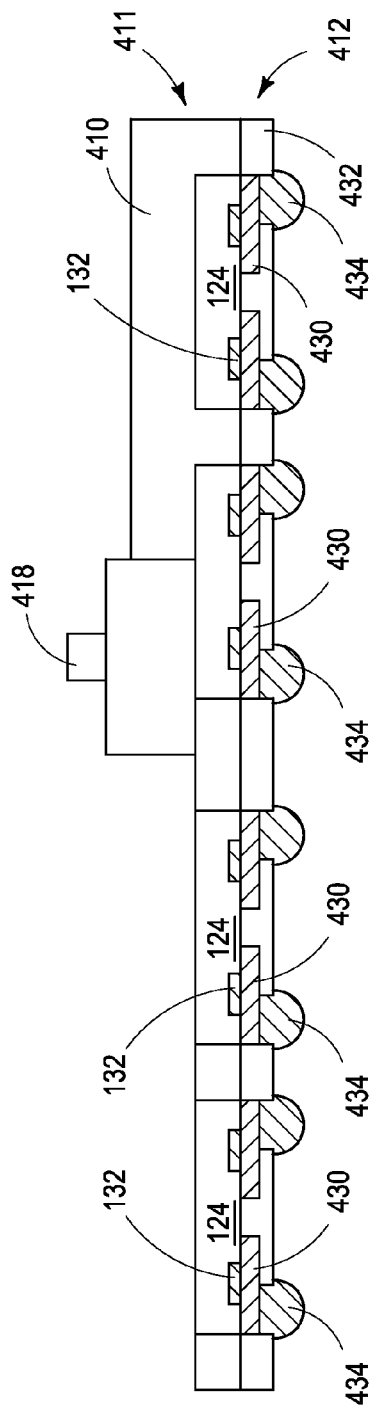
Figure 9G:
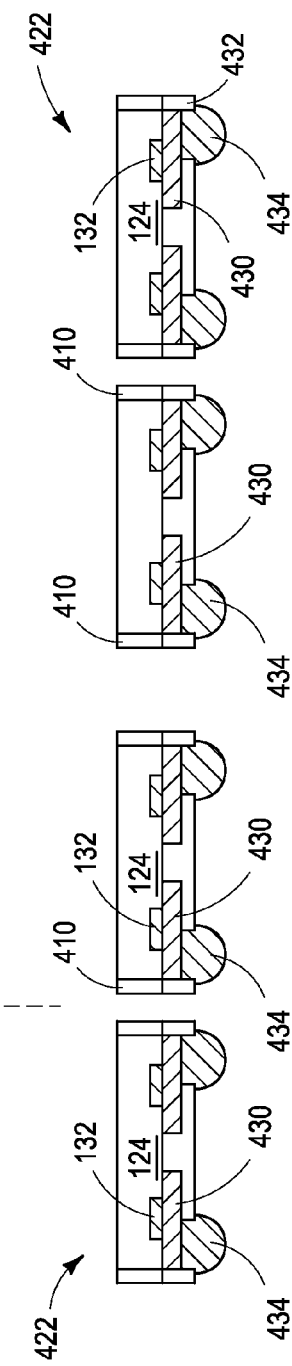

In FIG. 9f, a backside surface of encapsulant 410 undergoes an optional grinding operation with grinder 418 to planarize and reduce a thickness of encapsulant 410 and semiconductor die 124. The grinding operation removes a portion of encapsulant 410. In one embodiment, encapsulant material is removed down to back surface 128 of semiconductor die 124. A chemical etch can also be used to planarize and remove a portion of encapsulant 410 and semiconductor die 124. A chemical etch, CMP, or plasma dry etch can also be used to remove back grinding damage and reduce stress on semiconductor die 124 and encapsulant 410 to enhance the package strength. In one embodiment, encapsulant 410 remains over semiconductor die 124 after back grinding. After back grinding, reconstituted wafer or panel 411 is singulated as shown in FIG. 9g using a saw blade or laser cutting tool 420 to form individual semiconductor packages 422. Semiconductor packages 422 are eWLB packages or eWLCSP packages.

Figure 10C:
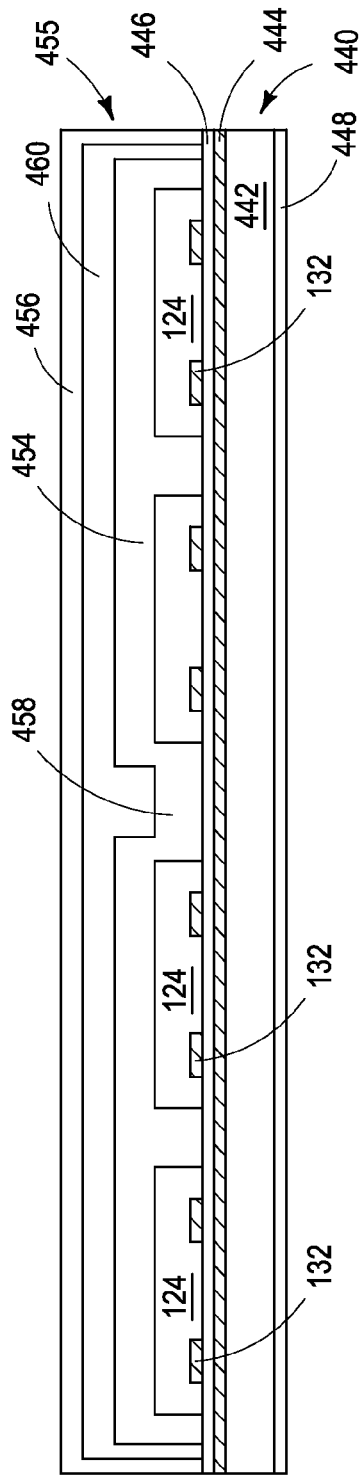

FIGS. 10a-10h show a process of forming a semiconductor device using a carrier with enhanced warpage control. In FIG. 10a, semiconductor die 124 from FIG. 3d are mounted to carrier 440. Carrier 440 is any carrier depicted in FIGS. 4a-4d or another variation with enhanced warpage control. Carrier 440 is depicted with base material 442 and metal film 444 deposited over base material 442. Interface layer or tape 446 is bonded to metal film 444. Composite layer 448 is bonded to the back surface of base material 442 to provide support and improve warpage characteristics. Semiconductor die 124 are mounted to carrier 440 and interface layer 446 using, for example, a pick and place operation with active surface 130 oriented toward the carrier. The thickness of semiconductor die 124 is less than 500 µm.

In FIG. 10b, chase mold or chamber 450 contains semiconductor die 124 in opening 452 and an insulating or composite layer 454 is formed over semiconductor die 124 within opening 452. Insulating layer 454 includes one or more laminated layers of prepreg with BT, FR-4, FR-1, CEM-1, or CEM-3, or other material having similar insulating and structural properties. Insulating layer 454 further includes an epoxy resin or polymer with a reinforcement fiber or fabric, such as phenolic cotton paper, epoxy, resin, woven glass, matte glass, polyester, and other reinforcement fibers or fabrics. In an alternative embodiment, insulating layer 454 contains a molding compound, polymer dielectric with or without fillers, one or more layers of $SiO_2$, $Si_3N_4$, SiON, $Ta_2O_5$, $Al_2O_3$, or other material having similar insulating and structural properties. Insulating layer 454 is deposited using vacuum or pressure lamination with or without heat, PVD, CVD, screen printing, spin coating, spray coating, injection coating, sintering, thermal oxidation, or other suitable process. In one embodiment, insulating layer 454 is a prepreg sheet, roll, or tape including a polymer matrix enhanced with woven glass fiber and deposited using vacuum or pressure lamination with or without heat. The material selected for insulating layer 454 enhances the overall strength of the semiconductor package and improves package warpage. The material for insulating layer 454 is selected to tune the CTE of panel 455. In one embodiment, insulating layer 454 has a CTE less than 10 ppm and is less than 100 µm thick.

FIG. 10c shows a chase mold 456 used to deposit encapsulant or molding compound 460 over and around semiconductor die 124 and insulating layer 454. Encapsulant 460 is deposited using a paste printing, compressive molding, transfer molding, liquid encapsulant molding, vacuum lamination, spin coating, or other suitable applicator. Encapsulant 460 is polymer composite material, such as epoxy resin with filler, epoxy acrylate with filler, or polymer with proper filler. Encapsulant 460 is non-conductive and environmentally protects the semiconductor die from external elements and contaminants. Encapsulant 460 also protects semiconductor die 124 from degradation due to exposure to light. The interface between encapsulant 460 and insulating layer 454 is flat or interlocking. The filler and CTE of encapsulant 460 are selected to aid with gap filling, warpage control, and reliability.

Figure 10D:
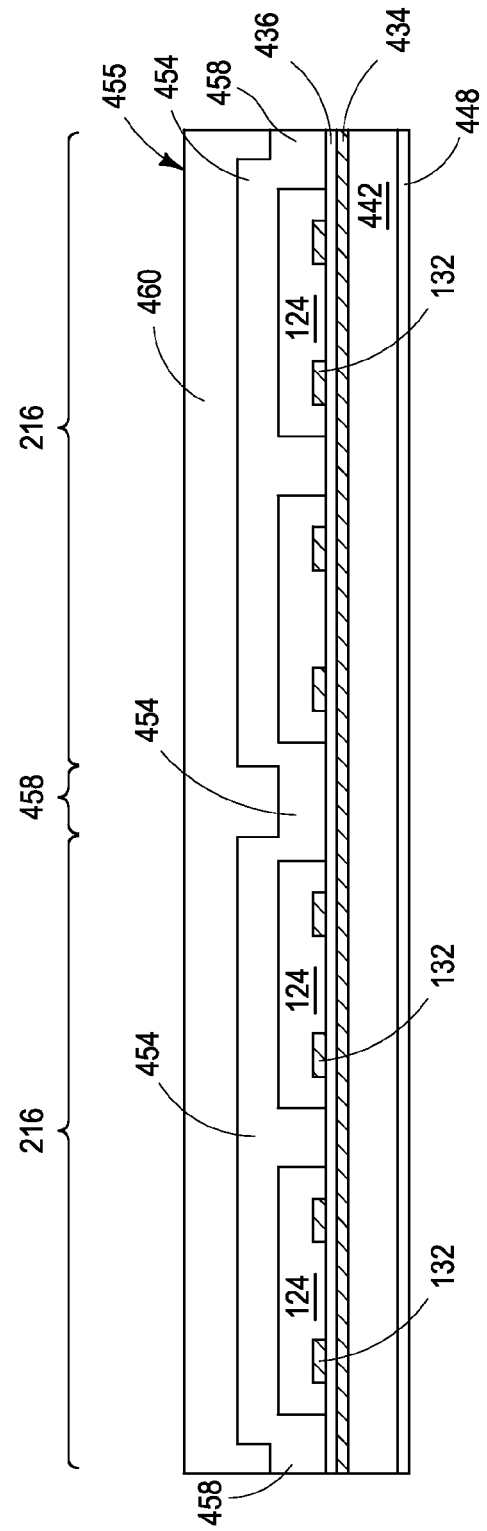

FIGS. 10d and 10e show panel 455 with encapsulant 460 deposited over insulating layer 454. In FIG. 10d, Panel 455 includes panel blocks with one or more semiconductor die or components 124 in each panel block. Panel blocks can also include one or more packages within each panel block. Panel blocks 216 are formed with gap 458 between adjacent panel blocks. In FIG. 10d, gaps 458 are filled with insulating layer 454 and encapsulant 460 deposited over insulating layer 454 in a central region of panel 455. Insulating layer 454 separates carrier 440 from encapsulant 460. In FIG. 10e, encapsulant 460 extends to a surface of carrier 440 around insulating layer 454 at ends of panel 455 to enclose insulating layer 454 and semiconductor die 124.

In FIG. 10f, carrier 440 including base material 442, metal film 444, and interface layer 446 are removed from panel 455 by chemical etching, mechanical peeling, chemical mechanical planarization (CMP), mechanical grinding, thermal bake, UV light, laser scanning, or wet stripping. Debonded panel 455 has a tuned CTE by including selected encapsulant 460, insulating layer 454, and thickness of die 124. Panel 455 with a properly tuned CTE has robust mechanical support to undergo further processing steps without a carrier. An electrically conductive layer or RDL 462 is formed over the active surface of semiconductor die 124, encapsulant 460, and insulating layer 454 using a patterning and metal deposition process such as sputtering, electrolytic plating, or electroless plating. Conductive layer 462 is one or more layers of Al, Ti, TiW, Cu, Sn, Ni, Au, Ag, or other suitable electrically conductive material. One portion of conductive layer 462 is electrically connected to contact pads 132 of semiconductor die 124. Portions of conductive layer 462 are electrically common or electrically isolated depending on the design and function of semiconductor die 124.

An insulating or passivation layer 464 is formed over the active surface of semiconductor die 124, insulating layer 454, and conductive layer 462 using PVD, CVD, printing, slit coating, spin coating, spray coating, injection coating, lamination, sintering, or thermal oxidation. The insulating layer 366 contains one or more layers of SiO2, Si3N4, SiON, Ta2O5, Al2O3, polymer dielectric resist with or without fillers or fibers, or other material having similar structural and insulating properties. An opening is formed by removing a portion of insulating layer 464 using an exposure or development process, LDA, etching, or other suitable process to expose conductive layer 462.

An electrically conductive bump material is deposited over the build-up interconnect structure and electrically connected to the exposed portion of conductive layer 462 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 462 using a suitable attachment or bonding process. In one embodiment, the bump material is reflowed by heating the material above its melting point to form spherical balls or bumps 466. In some applications, bumps 466 are reflowed a second time to improve electrical contact to conductive layer 462. An under bump metallization is formed under bumps 466. Bumps 466 can also be compression bonded to conductive layer 462. Bumps 466 represent one type of interconnect structure that can be formed over conductive layer 462. The interconnect structure can also use stud bump, micro bump, or other electrical interconnect.

Figure 10G:
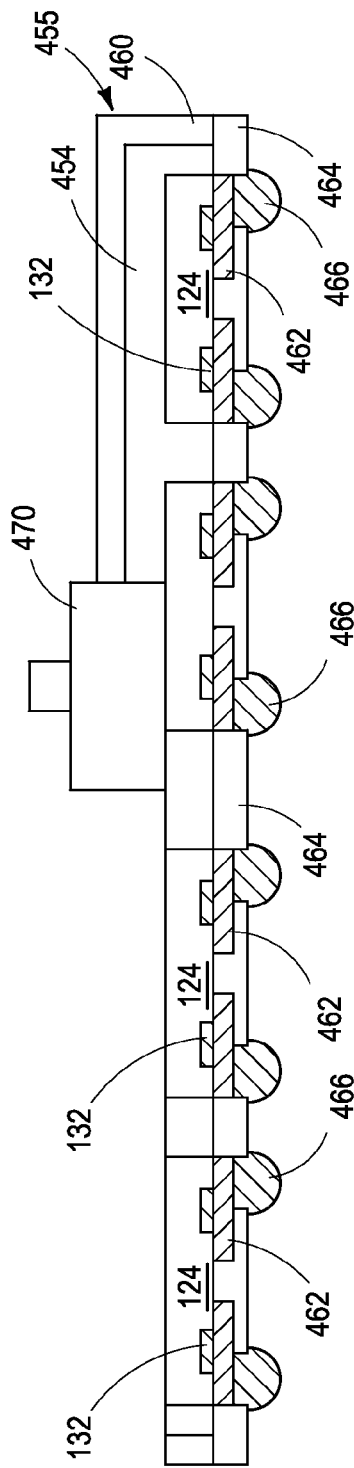
Figure 10H:
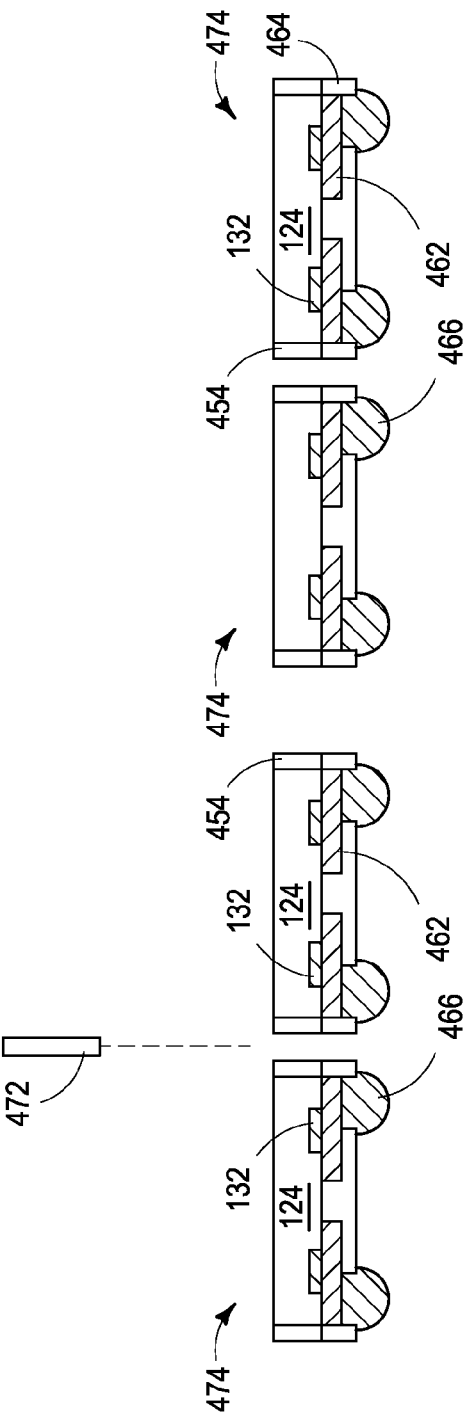

In FIG. 10g, a backside surface of encapsulant 460 undergoes an optional grinding operation with grinder 470 to planarize and reduce a thickness of insulating layer 454, encapsulant 460, and semiconductor die 124. The grinding operation removes a portion of encapsulant 460 and insulating layer 454. In one embodiment, encapsulant material is removed down to back surface 128 of semiconductor die 124. A chemical etch can also be used to planarize and remove a portion of encapsulant 460 and semiconductor die 124. A chemical etch, CMP, or plasma dry etch can also be used to remove back grinding damage and reduce stress on semiconductor die 124 and encapsulant 460 to enhance the package strength. In one embodiment, encapsulant 460 and insulating layer 454 remain over semiconductor die 124 after back grinding. After back grinding, reconstituted wafer or panel 455 is singulated as shown in FIG. 10h using a saw blade or laser cutting tool 472 to form individual semiconductor packages 474. Semiconductor packages 474 are eWLB packages or eWLCSP packages.

Figure 11A:
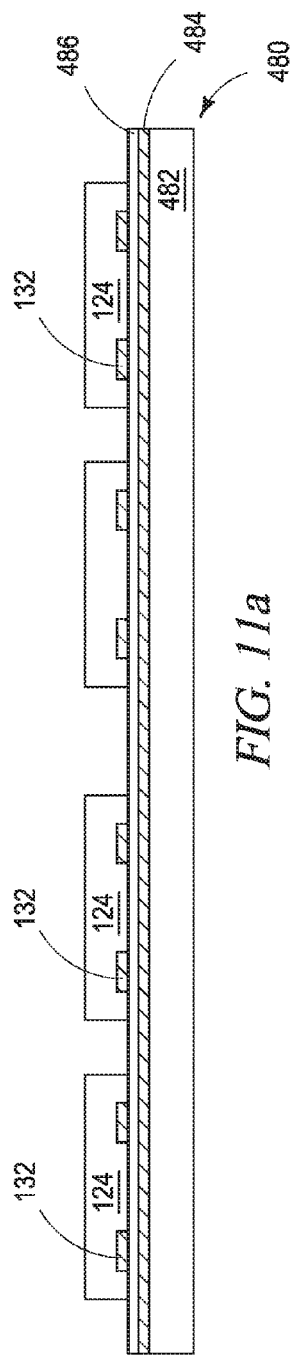

FIGS. 11a-11e show a process of forming a semiconductor device using a carrier with enhanced warpage control. In FIG. 11a, semiconductor die 124 from FIG. 3d are mounted to carrier 480. Carrier 480 is any carrier depicted in FIGS. 4a-4d or another variation with enhanced warpage control. Carrier 480 is depicted with base material 482 and metal film 484 deposited over base material 482. Interface layer or tape 486 is bonded to metal film 484. In one embodiment, a composite layer is bonded to the back surface of base material 482 to provide support and improve warpage characteristics. Semiconductor die 124 are mounted to carrier 480 and interface layer 486 using, for example, a pick and place operation with active surface 130 oriented toward the carrier.

Figure 11B:
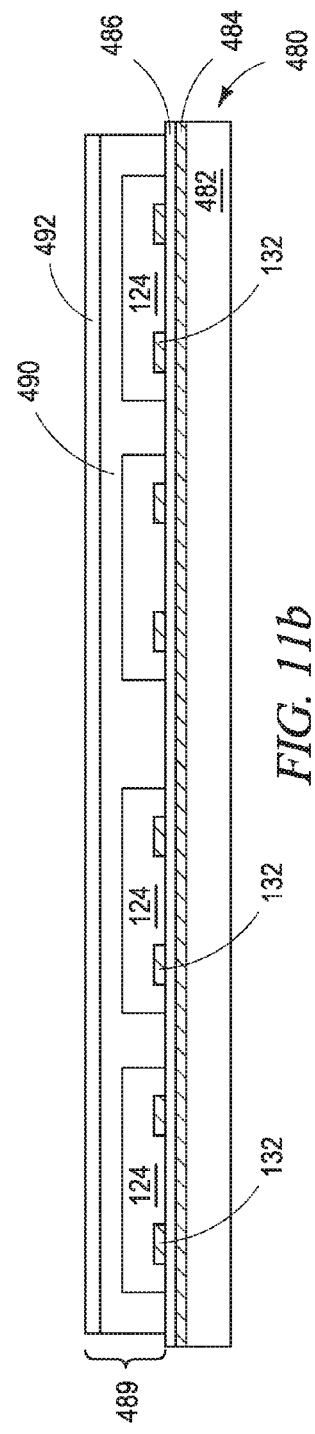

FIG. 11b shows a resin coated copper (RCC) film or laminate 489 deposited over and around semiconductor die 124. RCC film 489 includes metal foil 492 over resin film 490. In one embodiment, RCC film 489 includes copper foil 492. Resin film 490 is deposited using a paste printing, compressive molding, transfer molding, liquid encapsulant molding, vacuum lamination, spin coating, or other suitable applicator. In particular, resin film 490 covers the four side surfaces and back surface 128 of semiconductor die 124. Resin film 490 is polymer composite material, such as epoxy resin with filler, epoxy acrylate with filler, or polymer with proper filler. Resin film 490 is non-conductive and environmentally protects the semiconductor die from external elements and contaminants. Resin film 490 also protects semiconductor die 124 from degradation due to exposure to light. The CTE of resin film 490 is selected to aid with gap filling, warpage control, and reliability.

Figure 11C:
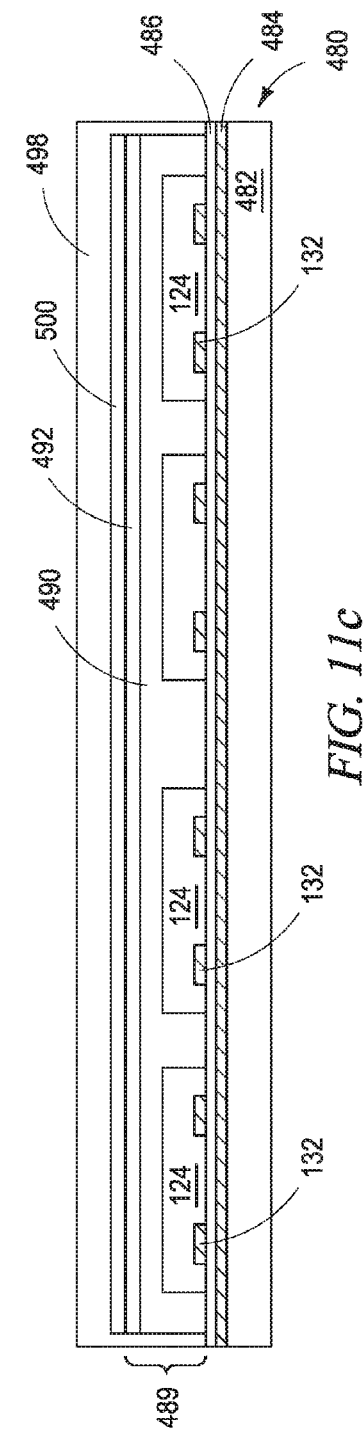

FIG. 11c shows chase mold 498 with opening 500 over resin film 490 and metal foil 492 to deposit encapsulant or molding compound 502 over semiconductor die 124 and RCC film 489. Encapsulant 502 is deposited using a paste printing, compressive molding, transfer molding, liquid encapsulant molding, vacuum lamination, spin coating, or other suitable applicator. Encapsulant 502 is polymer composite material, such as epoxy resin with filler, epoxy acrylate with filler, or polymer with proper filler. Encapsulant 502 is non-conductive and environmentally protects the semiconductor die from external elements and contaminants. Encapsulant 502 also protects semiconductor die 124 from degradation due to exposure to light. In one embodiment, the thickness of encapsulant 502 over the back surface of foil 492 is 0.75 to 1.5 times the maximum filler cut of the encapsulant. The filler and CTE of encapsulant 502 are selected to aid with gap filling, warpage control, and reliability.

FIG. 11*d* shows chase mold 498 removed from carrier 480 leaving encapsulated panel 503. Encapsulated panel 503 includes semiconductor die 124, encapsulant 502, resin film 490, and metal foil 492 over carrier 480.

In FIG. 11*e*, carrier 480 including base material 482, interface layer 486, and metal film 484 are removed from panel 503 by chemical etching, mechanical peeling, chemical mechanical planarization (CMP), mechanical grinding, thermal bake, UV light, laser scanning, or wet stripping. Debonded panel 503 has a tuned CTE by including selected RCC film 489, encapsulant 502, and thickness of die 124. Panel 503 with a properly tuned CTE has robust mechanical support to undergo further processing steps without a carrier.

FIG. 11*f* shows an embodiment similar to that in FIG. 11*d*. Encapsulant 502 extends around resin film 490 and metal foil 492 to carrier 480 to enclose panel 503. Encapsulant 502 is formed completely around panel 503.

In FIG. 11*g*, an electrically conductive layer or RDL 506 is formed over the active surface of semiconductor die 124, RCC film 489, and encapsulant 502 using a patterning and metal deposition process such as sputtering, electrolytic plating, or electroless plating. Conductive layer 506 is one or more layers of Al, Ti, TiW, Cu, Sn, Ni, Au, Ag, or other suitable electrically conductive material. One portion of conductive layer 506 is electrically connected to contact pads 132 of semiconductor die 124. Portions of conductive layer 506 are electrically common or electrically isolated depending on the design and function of semiconductor die 124.

An insulating or passivation layer 508 is formed over the active surface of semiconductor die 124, RCC film 489, and conductive layer 506 using PVD, CVD, printing, slit coating, spin coating, spray coating, injection coating, lamination, sintering, or thermal oxidation. The insulating layer 508 contains one or more layers of $SiO_2$, $Si_3N_4$, SiON, $Ta_2O_5$, $Al_2O_3$, polymer dielectric resist with or without fillers or fibers, or other material having similar structural and insulating properties. An opening is formed by removing a portion of insulating layer 508 using an exposure or development process, LDA, etching, or other suitable process to expose conductive layer 506.

An electrically conductive bump material is deposited over the build-up interconnect structure and electrically connected to the exposed portion of conductive layer 506 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 506 using a suitable attachment or bonding process. In one embodiment, the bump material is reflowed by heating the material above its melting point to form spherical balls or bumps 510. In some applications, bumps 510 are reflowed a second time to improve electrical contact to conductive layer 506. An under bump metallization is formed under bumps 510. Bumps 510 can also be compression bonded to conductive layer 506. Bumps 510 represent one type of interconnect structure that can be formed over conductive layer 506. The interconnect structure can also use stud bump, micro bump, or other electrical interconnect.

Figure 12C:
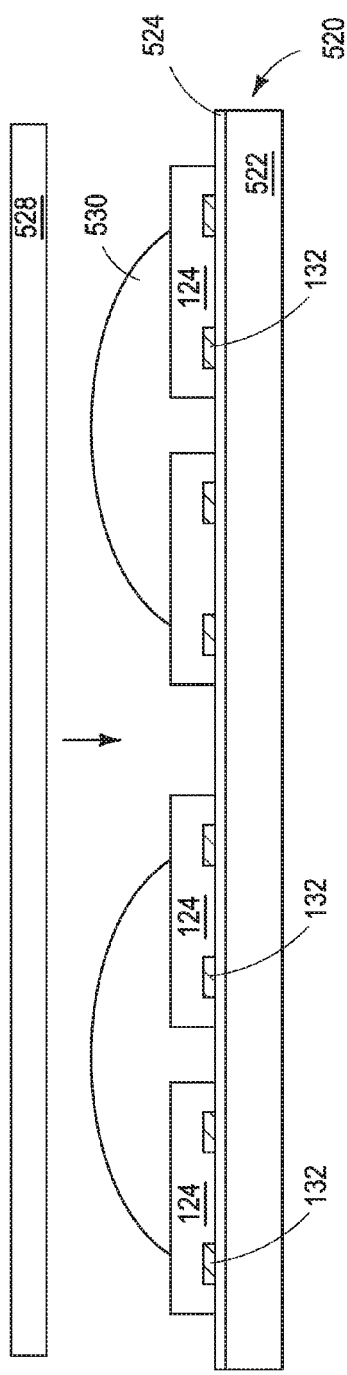

FIGS. 12*a*-12*e* show a process of forming a semiconductor device including a glass support panel embedded in a fan-out substrate. In FIG. 12*a*, semiconductor die 124 from FIG. 3*d* are mounted to carrier 520. Carrier 520 contains base material 522 such as polycrystal silicon, polymer, glass, or other suitable low-cost, rigid material for structural support. An interface layer or double-sided tape 524 is formed over base material 522 as a temporary adhesive bonding film, etch-stop layer, or thermal release layer. In some embodiments, carrier 520 also includes a fiber or filler enhanced composite layer for support. Semiconductor die 124 are mounted to carrier 520 and interface layer 524 using, for example, a pick and place operation with active surface 130 oriented toward the carrier. Encapsulant or molding compound 530 is deposited on glass panel 528. Encapsulant 530 is deposited using a paste printing, compressive molding, transfer molding, liquid encapsulant molding, vacuum lamination, spin coating, or other suitable applicator.

In FIG. 12*b*, glass panel 528 is pressed into semiconductor die 124 and carrier 520 with the encapsulant oriented towards carrier 520. Encapsulant 530 is polymer composite material, such as epoxy resin with filler, epoxy acrylate with filler, or polymer with proper filler. Encapsulant 530 is non-conductive and environmentally protects the semiconductor die from external elements and contaminants. Encapsulant 530 also protects semiconductor die 124 from degradation due to exposure to light. The filler and CTE of encapsulant 530 are selected to aid with gap filling, warpage control, and reliability. The encapsulant is deposited over and around semiconductor die 124 and over carrier 520, with glass panel 528 embedded in encapsulant 530. The glass panel is smaller than the fan-out substrate so that encapsulant 530 extends over side surfaces of embedded glass panel 528. In one embodiment, glass panel 528 is at least 3 mm smaller than the fan-out substrate so that at least 3 mm of encapsulant is disposed around glass substrate 528.

In FIG. 12*c*, semiconductor die 124 from FIG. 3*d* are mounted to carrier 520. Carrier 520 contains base material 522 such as polycrystal silicon, polymer, glass, or other suitable low-cost, rigid material for structural support. An interface layer or double-sided tape 524 is formed over base material 522 as a temporary adhesive bonding film, etch-stop layer, or thermal release layer. In some embodiments, carrier 520 also includes a fiber or filler enhanced composite layer for support. Semiconductor die 124 are mounted to carrier 520 and interface layer 524 using, for example, a pick and place operation with active surface 130 oriented toward the carrier. Encapsulant or molding compound 530 is deposited over semiconductor die 124 and substrate 520. Encapsulant 530 is deposited using a paste printing, compressive molding, transfer molding, liquid encapsulant molding, vacuum lamination, spin coating, or other suitable applicator.

Figure 12D:
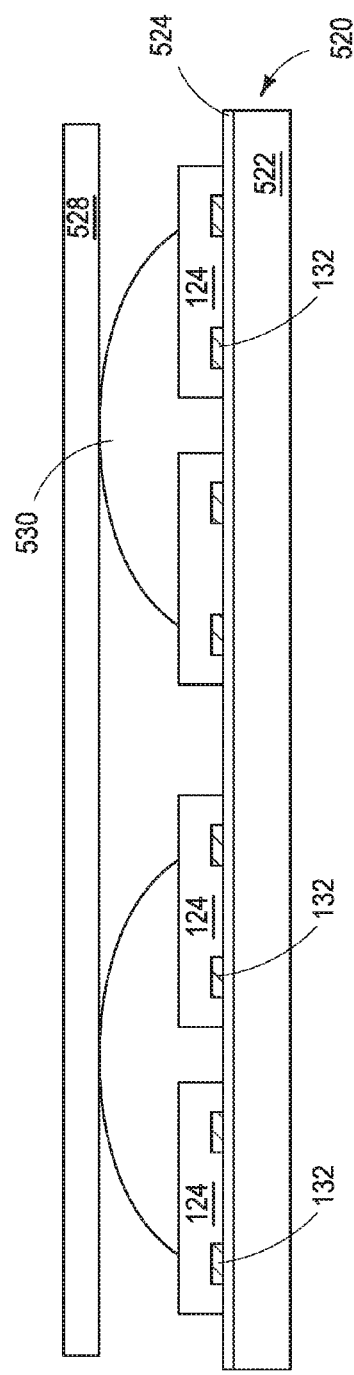

FIG. 12*d* shows glass panel 528 is pressed into semiconductor die 124 and carrier 520 with the encapsulant 530 between glass panel and carrier 520 to spread encapsulant 530 over semiconductor die 124. Encapsulant 530 is polymer composite material, such as epoxy resin with filler, epoxy acrylate with filler, or polymer with proper filler. Encapsulant 530 is non-conductive and environmentally protects the semiconductor die from external elements and contaminants. Encapsulant 530 also protects semiconductor die 124 from degradation due to exposure to light. The filler and CTE of encapsulant 530 are selected to aid with gap filling, warpage control, and reliability. The encapsulant is deposited over and around semiconductor die 124 and over carrier 520, with glass panel 528 embedded in encapsulant 530. Glass panel 528 is smaller than the fan-out substrate so that encapsulant 530 extends over side surfaces of embedded glass panel 528. In one embodiment, glass panel 528 is at least 3 mm smaller than the fan-out substrate so that at least 3 mm of encapsulant is disposed around glass substrate 528.

In FIG. 12e, carrier 520 including base material 522 and interface layer 524 are removed from panel 531 by chemical etching, mechanical peeling, chemical mechanical planarization (CMP), mechanical grinding, thermal bake, UV light, laser scanning, or wet stripping. Debonded panel 531 has a tuned CTE by including selected encapsulant 530, glass 528, and thickness of die 124. Panel 531 with a properly tuned CTE has robust mechanical support to undergo further processing steps without a carrier.

In FIG. 12f, an electrically conductive layer or RDL 532 is formed over the active surface of semiconductor die 124 and encapsulant 530 using a patterning and metal deposition process such as sputtering, electrolytic plating, or electroless plating. Conductive layer 532 is one or more layers of Al, Ti, TiW, Cu, Sn, Ni, Au, Ag, or other suitable electrically conductive material. One portion of conductive layer 532 is electrically connected to contact pads 132 of semiconductor die 124. Portions of conductive layer 532 are electrically common or electrically isolated depending on the design and function of semiconductor die 124.

An insulating or passivation layer 536 is formed over the active surface of semiconductor die 124, encapsulant 530, and conductive layer 532 using PVD, CVD, printing, slit coating, spin coating, spray coating, injection coating, lamination, sintering, or thermal oxidation. The insulating layer 536 contains one or more layers of SiO2, Si3N4, SiON, Ta2O5, Al2O3, polymer dielectric resist with or without fillers or fibers, or other material having similar structural and insulating properties. An opening is formed by removing a portion of insulating layer 536 using an exposure or development process, LDA, etching, or other suitable process to expose conductive layer 532.

An electrically conductive bump material is deposited over the build-up interconnect structure and electrically connected to the exposed portion of conductive layer 532 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 532 using a suitable attachment or bonding process. In one embodiment, the bump material is reflowed by heating the material above its melting point to form spherical balls or bumps 538. In some applications, bumps 538 are reflowed a second time to improve electrical contact to conductive layer 532. An under bump metallization is formed under bumps 538. Bumps 538 can also be compression bonded to conductive layer 532. Bumps 538 represent one type of interconnect structure that is formed over conductive layer 532. The interconnect structure can also use stud bump, micro bump, or other electrical interconnect.

Figure 12G:
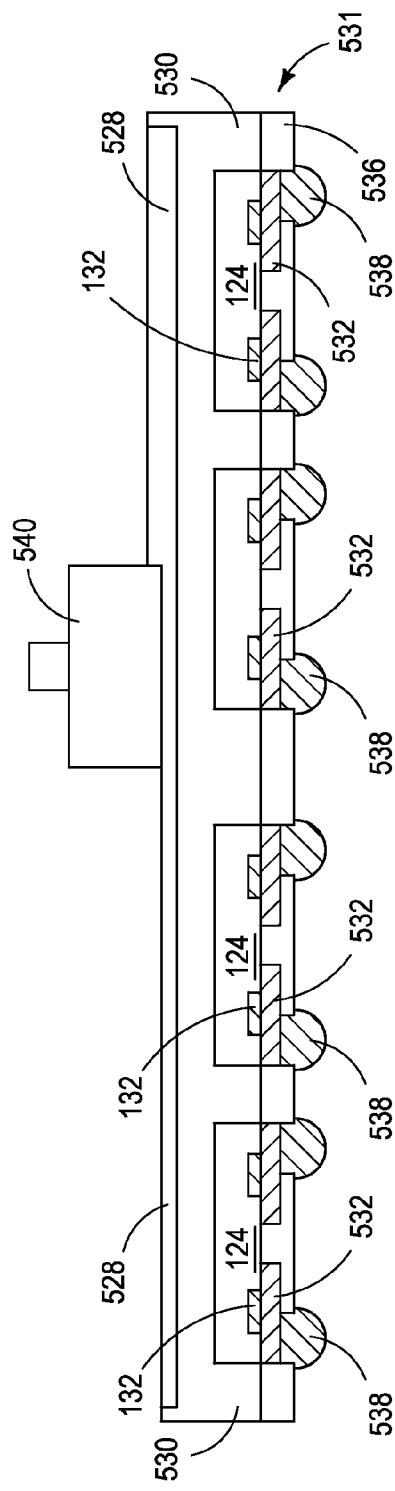
Figure 12H:
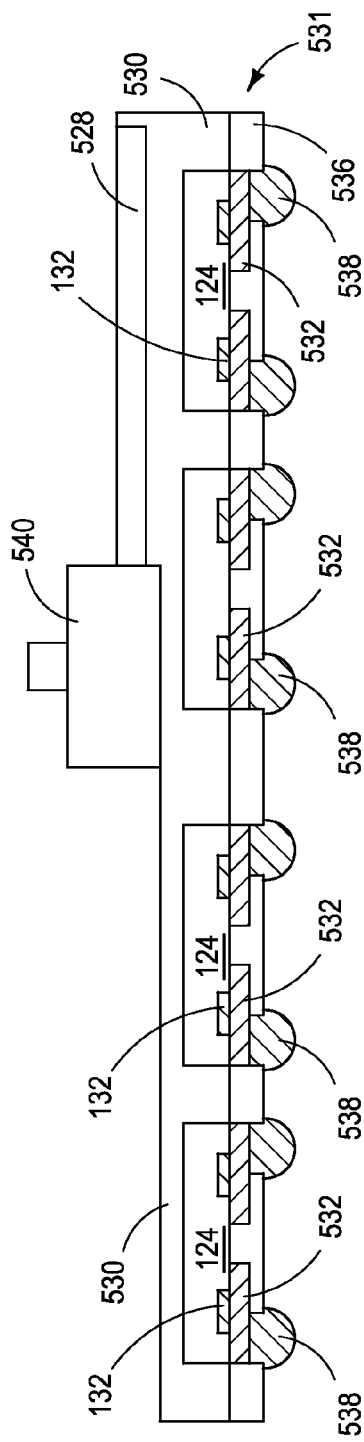
Figure 12I:
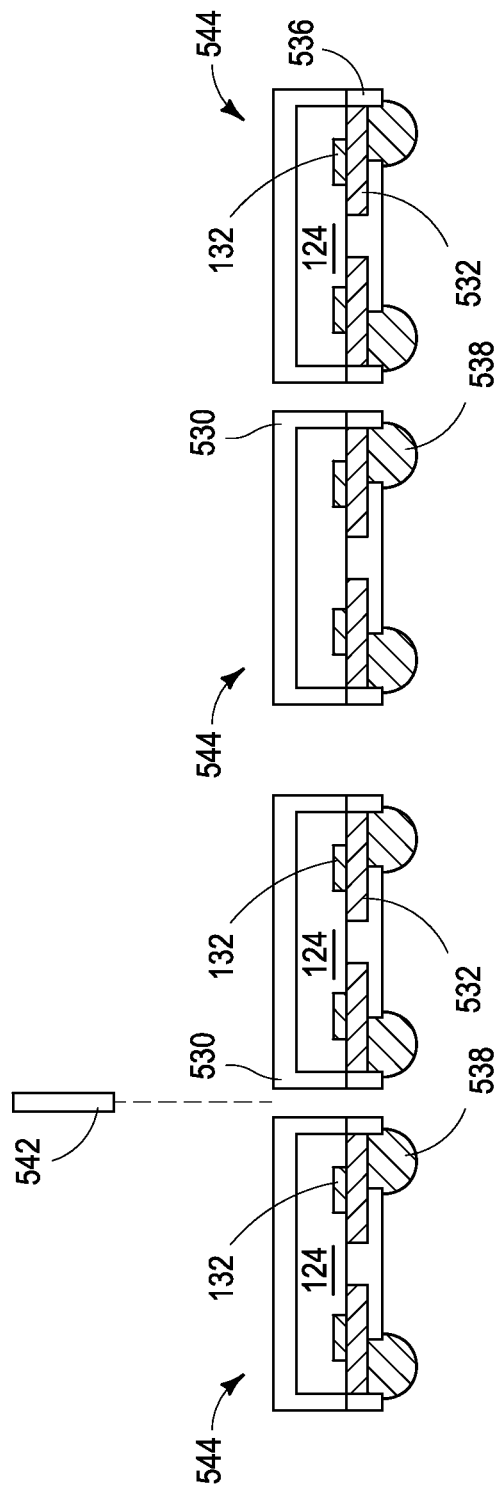

In FIG. 12g, a backside surface of encapsulant 530 undergoes a grinding operation with grinder 540 to planarize and reduce a thickness of insulating layer 366, encapsulant 530, and semiconductor die 124. The grinding operation removes a portion of encapsulant 530 and a portion of glass panel 528. In one embodiment, encapsulant material and glass is removed down to back surface 128 of semiconductor die 124. A chemical etch can also be used to planarize and remove a portion of encapsulant 530 and semiconductor die 124. A chemical etch, CMP, or plasma dry etch can also be used to remove back grinding damage and reduce stress on semiconductor die 124 and encapsulant 530 to enhance the package strength. Encapsulant 530 and glass panel 528 remain over semiconductor die 124 after back grinding. Alternatively, in FIG. 12h, glass panel 528 is completely removed, exposing the back surface of semiconductor die 124 or exposing encapsulant 530 over back surface of semiconductor die 124. After back grinding, reconstituted wafer or panel 531 is singulated as shown in FIG. 12i using a saw blade or laser cutting tool 542 to form individual semiconductor packages 544. Alternatively, glass 528 is debonded from panel 531 and reused. Semiconductor packages 544 are eWLB packages or eWLCSP packages including fan-out or fan-in interconnect structures.

While one or more embodiments of the present invention have been illustrated in detail, the skilled artisan will appreciate that modifications and adaptations to the embodiments may be made without departing from the scope of the present invention as set forth in the following claims.

What is claimed:

1. A method of making a semiconductor device, comprising:
    providing a carrier including,
        (a) a first glass substrate,
        (b) a composite layer bonded to a first surface of the first glass substrate, and
        (c) a metal film bonded to a second surface of the first glass substrate opposite the first surface of the first glass substrate;
    forming a panel on the carrier, the panel including a plurality of panel blocks with each panel block containing a plurality of semiconductor die including an active surface and a back surface opposite the active surface;
    depositing an encapsulant over the back surface of the plurality of semiconductor die including forming a vertical recess in the encapsulant between adjacent panel blocks interior to the panel with a portion of the encapsulant disposed below the recess and between the plurality of semiconductor die, wherein the encapsulant extends vertically along side surfaces of the plurality of semiconductor die to a level of the active surface of the plurality of semiconductor die around a perimeter of the panel; and
    forming a support layer including a composite insulating material comprising fiber in contact with a surface of the encapsulant over the back surface of the plurality of semiconductor die and into the vertical recess and over the encapsulant on the side surfaces of the plurality of semiconductor die to the level of the active surface of the plurality of semiconductor die around the perimeter of the panel.

2. The method of claim 1, further including:
    removing the carrier; and
    forming a conductive layer over the plurality of semiconductor die.

3. The method of claim 2, further including forming an insulating layer over the conductive layer.

4. The method of claim 2, further including forming a plurality of interconnect structures over the conductive layer.

5. The method of claim 1, wherein the composite layer includes a prepreg material.

6. The method of claim 1, further including bonding a second glass substrate to the composite layer opposite the first glass substrate.

7. The method of claim 1, further including disposing a plurality of support members around the panel blocks.

8. A method of making a semiconductor device, comprising:
providing a carrier including,
(a) a first glass substrate,
(b) a composite layer bonded to a first surface of the first glass substrate, and
(c) a metal film bonded to a second surface of the glass substrate opposite the first surface of the first glass substrate;
disposing a plurality of semiconductor die over the carrier;
depositing an encapsulant over the plurality of semiconductor die; and
forming a support layer including a composite insulating material comprising a prepreg material over the encapsulant.

9. The method of claim 8, further including:
removing the carrier; and
forming a conductive layer over the plurality of semiconductor die.

10. The method of claim 9, further including forming an insulating layer over the conductive layer.

11. The method of claim 9, further including forming a plurality of bumps over the conductive layer.

12. The method of claim 8, wherein the composite layer includes a prepreg material.

13. The method of claim 8, further including bonding a second glass substrate to the composite layer opposite the first glass substrate.

14. The method of claim 8, further including forming the support layer into a recess in the encapsulant between the plurality of semiconductor die.

15. A semiconductor device, comprising:
a carrier including,
(a) a first glass substrate,
(b) a composite layer bonded to a first surface of the first glass substrate,
(c) a first metal film bonded to a second surface of the first glass substrate opposite the first surface of the first glass substrate, and
(d) an interface layer formed on the first metal film;
a panel disposed on the carrier, the panel including a plurality of panel blocks with each panel block containing a plurality of semiconductor die including an active surface and a back surface opposite the active surface;
an encapsulant disposed over the back surface of the plurality of semiconductor die and between the plurality of semiconductor die and including a vertical recess formed in the encapsulant between adjacent panel blocks interior to the panel with a portion of the encapsulant disposed below the recess and between the adjacent panel blocks, wherein the encapsulant extends vertically along side surfaces of the plurality of semiconductor die to a level of the active surface of the plurality of semiconductor die around a perimeter of the panel; and
a support layer including a composite material comprising a glass fiber in contact with a surface of the encapsulant over the back surface of the plurality of semiconductor die and extending into the vertical recess and over the encapsulant on the side surfaces of the plurality of semiconductor die to the level of the active surface of the plurality of semiconductor die around the perimeter of the panel.

16. The semiconductor device of claim 15, wherein the composite layer includes a second metal film.

17. The semiconductor device of claim 15, wherein the composite material includes a prepreg material.

18. The semiconductor device of claim 15, further including a second glass substrate bonded to the composite layer opposite the first glass substrate.

19. The semiconductor device of claim 15, wherein the composite layer includes a prepreg material.

20. The semiconductor device of claim 15, further including a plurality of support members disposed around the panel blocks.

21. A semiconductor device, comprising:
a carrier including,
(a) a first glass substrate,
(b) a composite layer bonded to a first surface of the first glass substrate, and
(c) a metal film bonded to a second surface of the glass substrate opposite the first surface of the first glass substrate;
a panel disposed on the carrier, the panel including a plurality of panel blocks with each panel block containing a plurality of semiconductor die;
an encapsulant disposed over a back surface opposite an active surface of the plurality of semiconductor die and between the plurality of semiconductor die and including a vertical recess formed in the encapsulant between adjacent panel blocks interior to the panel, wherein the encapsulant extends vertically along side surfaces of the plurality of semiconductor die to a level of the active surface of the plurality of semiconductor die around a perimeter of the panel; and
a support layer including a composite insulating material comprising fiber in contact with a surface of the encapsulant over the back surface of the plurality of semiconductor die and extending into the vertical recess and over the encapsulant on the side surfaces of the plurality of semiconductor die to the level of the active surface of the plurality of semiconductor die around the perimeter of the panel.

22. The semiconductor device of claim 21, wherein the composite layer includes material selected from the group consisting of prepreg, epoxy resin, polymer, fabric, and glass fiber.

23. The semiconductor device of claim 21, further including a plurality of support members disposed around the panel blocks.

24. The semiconductor device of claim 21, wherein the composite insulating material includes glass.

25. The semiconductor device of claim 21, wherein the composite insulating material includes a prepreg material.

26. The semiconductor device of claim 21, wherein the composite layer includes a prepreg material.

27. The semiconductor device of claim 21, further including a second glass substrate bonded to the composite layer opposite the first glass substrate.

28. A semiconductor device, comprising:
a carrier including,
(a) a first glass substrate,
(b) a first metal film bonded to cover an entirety of a first surface of the first glass substrate, and
(c) a second metal film bonded to cover an entirety of a second surface of the first glass substrate opposite the first surface of the first glass substrate;
a plurality of semiconductor die disposed over the carrier;
an encapsulant disposed over the plurality of semiconductor die; and a support layer including a composite insulating material comprising a prepreg material formed over the encapsulant.

29. The semiconductor device of claim 28, further including a vertical recess formed in the encapsulant between adjacent ones of the plurality of semiconductor die, wherein the encapsulant extends vertically along side surfaces of the plurality of semiconductor die to a level of an active surface of the plurality of semiconductor die.

30. The semiconductor device of claim 29, wherein the support layer extends into the vertical recess and over the encapsulant on the side surfaces of the plurality of semiconductor die to the level of the active surface of the plurality of semiconductor die.

31. The semiconductor device of claim 28, further including a plurality of support members disposed around the plurality of semiconductor die with a height of a first support member of the plurality of support members less than or equal to the height of a first semiconductor die of the plurality of semiconductor die.

32. The semiconductor device of claim 28, further including a second glass substrate bonded to the first metal film opposite the first glass substrate.

33. A semiconductor device, comprising:
a carrier including,
  (a) a first substrate,
  (b) a composite layer bonded to a first surface of the first substrate, and
  (c) a metal film bonded to a second surface of the substrate opposite the first surface of the first substrate;
a plurality of semiconductor die disposed over the carrier;
an encapsulant disposed over the plurality of semiconductor die; and
a support layer including a glass substrate embedded in the encapsulant.

34. The semiconductor device of claim 33, further including a vertical recess formed in the encapsulant between adjacent ones of the plurality of semiconductor die, wherein the encapsulant extends vertically along side surfaces of the plurality of semiconductor die to a level of an active surface of the plurality of semiconductor die, wherein the support layer extends into the vertical recess and over the encapsulant on the side surfaces of the plurality of semiconductor die to the level of the active surface of the plurality of semiconductor die.

35. The semiconductor device of claim 33, further including a plurality of support members disposed around the plurality of semiconductor die.

36. The semiconductor device of claim 33, further including a second substrate bonded to the composite layer opposite the first substrate.

* * * * *